(12) United States Patent
Arao et al.

(10) Patent No.: US 7,465,958 B2
(45) Date of Patent: Dec. 16, 2008

(54) THIN FILM TRANSISTOR, SEMICONDUCTOR DEVICE, AND METHOD FOR MANUFACTURING THE SAME

(75) Inventors: Tatsuya Arao, Atsugi (JP); Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 359 days.

(21) Appl. No.: 11/071,255

(22) Filed: Mar. 4, 2005

(65) Prior Publication Data
US 2005/0199878 A1 Sep. 15, 2005

(30) Foreign Application Priority Data
Mar. 12, 2004 (JP) .............................. 2004-071793

(51) Int. Cl.
*H01L 29/76* (2006.01)
(52) U.S. Cl. .......................... 257/66; 257/72; 257/347
(58) Field of Classification Search .................. 257/66, 257/72, 347
See application file for complete search history.

(56) References Cited

U.S. PATENT DOCUMENTS

| | | |
|---|---|---|
| 4,462,041 A | 7/1984 | Glenn |
| 4,639,621 A | 1/1987 | Ikawa et al. |
| 5,034,792 A | 7/1991 | Kimura et al. |
| 5,047,360 A | 9/1991 | Nicholas |
| 5,097,297 A | 3/1992 | Nakazawa |
| 5,414,278 A | 5/1995 | Kobayashi et al. |
| 5,589,406 A | 12/1996 | Kato et al. |
| 5,598,106 A | 1/1997 | Kawasaki et al. |
| 5,731,613 A | 3/1998 | Yamazaki et al. |
| 5,959,313 A | 9/1999 | Yamazaki et al. |
| 6,019,796 A | 2/2000 | Mei et al. |

(Continued)

FOREIGN PATENT DOCUMENTS

EP          0609867          8/1994

(Continued)

OTHER PUBLICATIONS

Australian Patent Office Search Report dated Mar. 15, 2006 from Intellectual Property Office of Singapore for Singapore Application No. 200501171-3.

*Primary Examiner*—Jack Chen
(74) *Attorney, Agent, or Firm*—Eric J. Robinson; Robinson Intellectual Property Law Office, P.C.

(57) ABSTRACT

A semiconductor element is operated without being affected even when the substrate is largely affected by heat shrink such as a large substrate. Furthermore, a thin film semiconductor circuit and a thin film semiconductor device each having the semiconductor element. Also, a semiconductor element is operated without being affected even if there is slight mask deviation. In view of them, a plurality of gate electrodes formed so as to overlap a lower concentration impurity region of a semiconductor layer than drain regions on a drain region side. Also, source regions and the drain regions corresponding to the respective gate electrodes are formed so that current flows in opposite directions each other through channel regions corresponding to the gate electrodes. Further, the number of the channel regions in which a current flows in a first direction is equal to the number of the channel regions in which a current flows in a direction opposite to the first direction.

8 Claims, 23 Drawing Sheets

U.S. PATENT DOCUMENTS

| | | |
|---|---|---|
| 6,355,940 B1 | 3/2002 | Koga et al. |
| 6,549,184 B1 | 4/2003 | Koyama et al. |
| 7,304,625 B2 | 12/2007 | Koyama et al. |
| 2005/0041005 A1 | 2/2005 | Yamazaki et al. |
| 2006/0175612 A1 | 8/2006 | Yamazaki et al. |

FOREIGN PATENT DOCUMENTS

| | | |
|---|---|---|
| JP | 05-251700 | 9/1993 |
| JP | 06-123896 | 5/1994 |
| JP | 2002-175984 | 6/2002 |
| JP | 2003-335547 | 11/2003 |

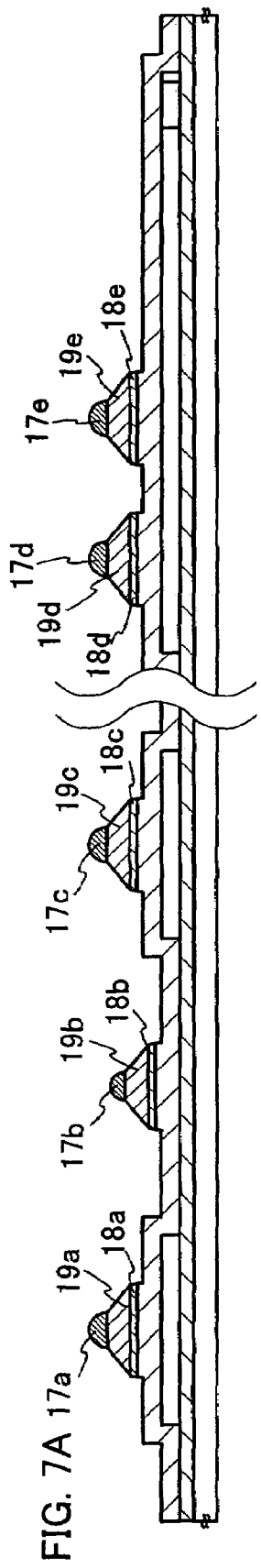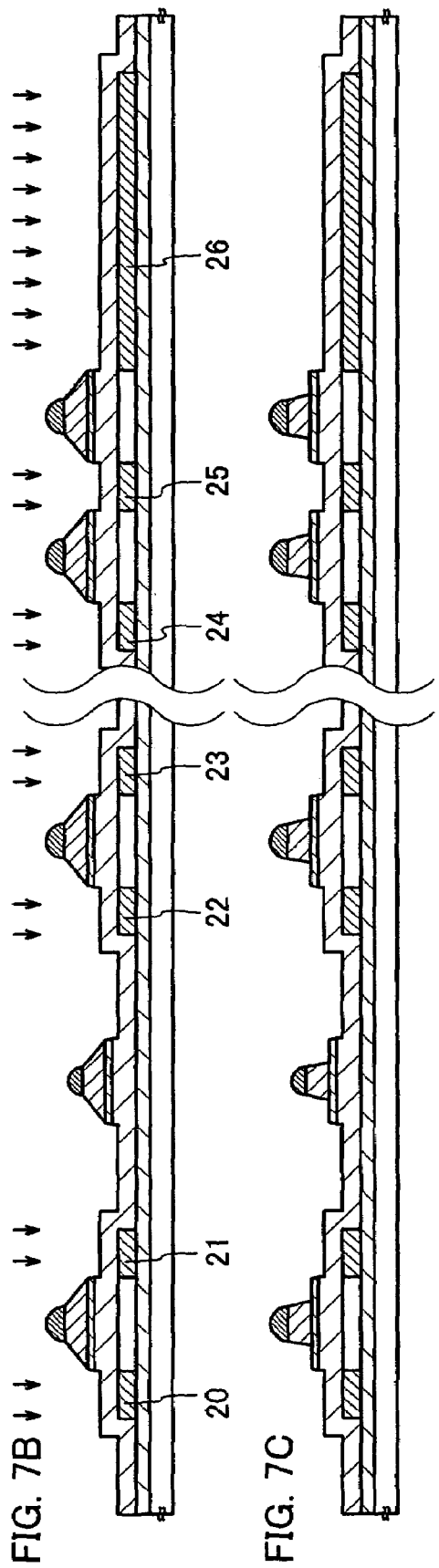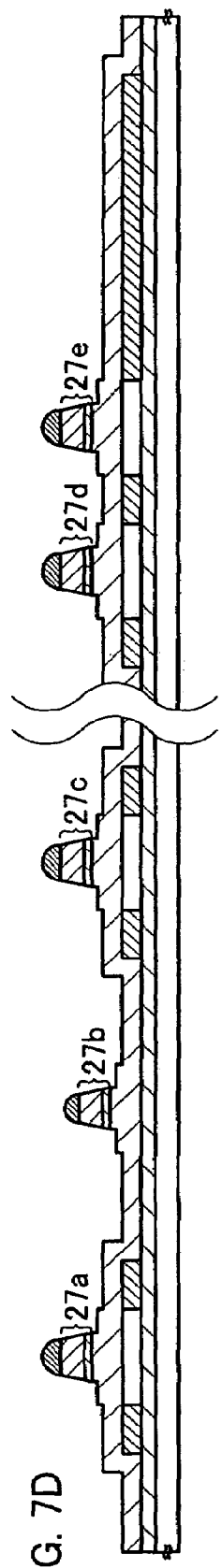

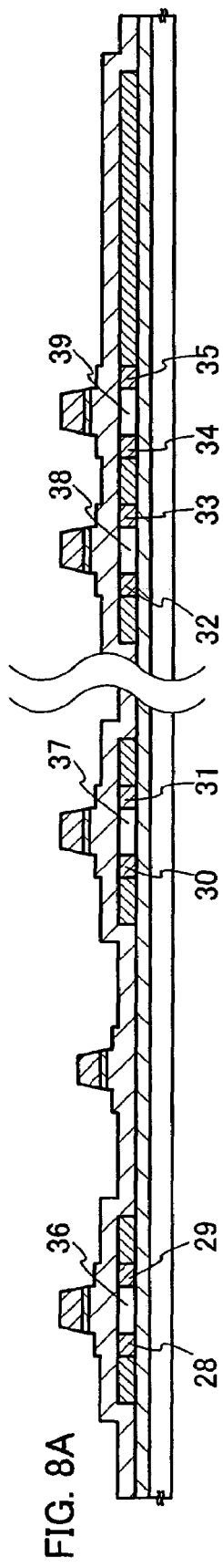
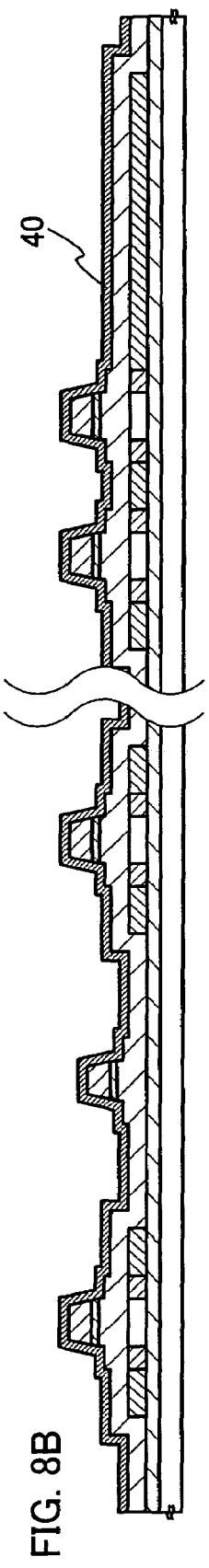
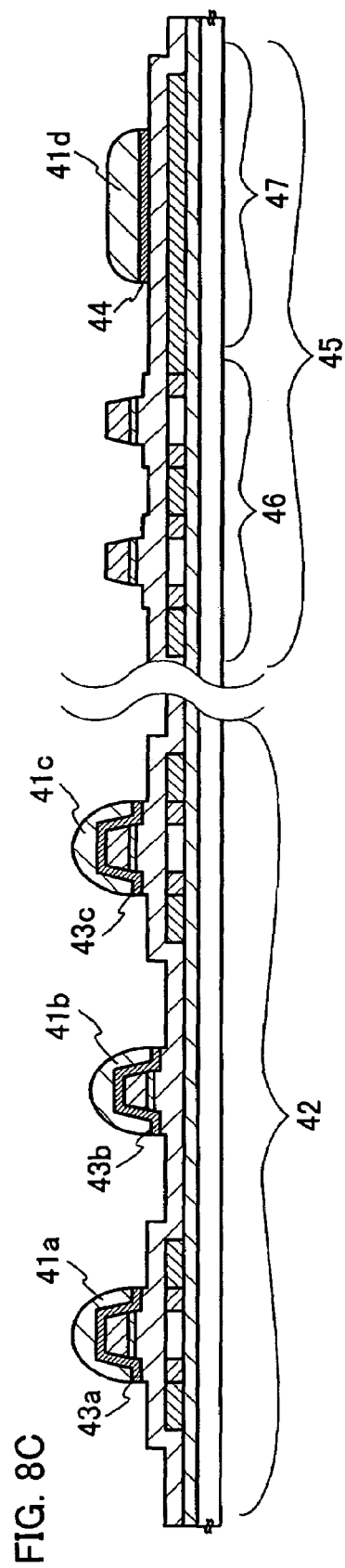
FIG. 8A
FIG. 8B
FIG. 8C

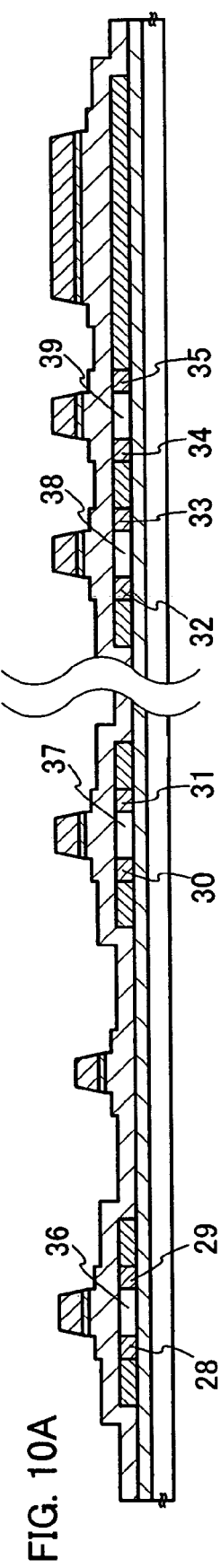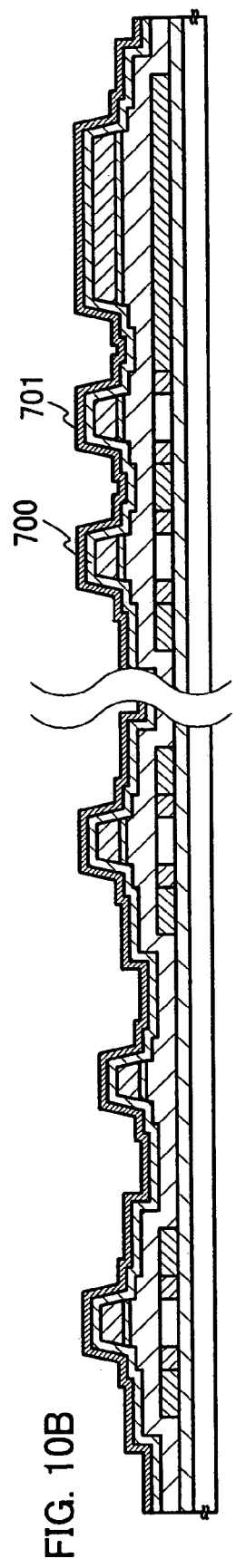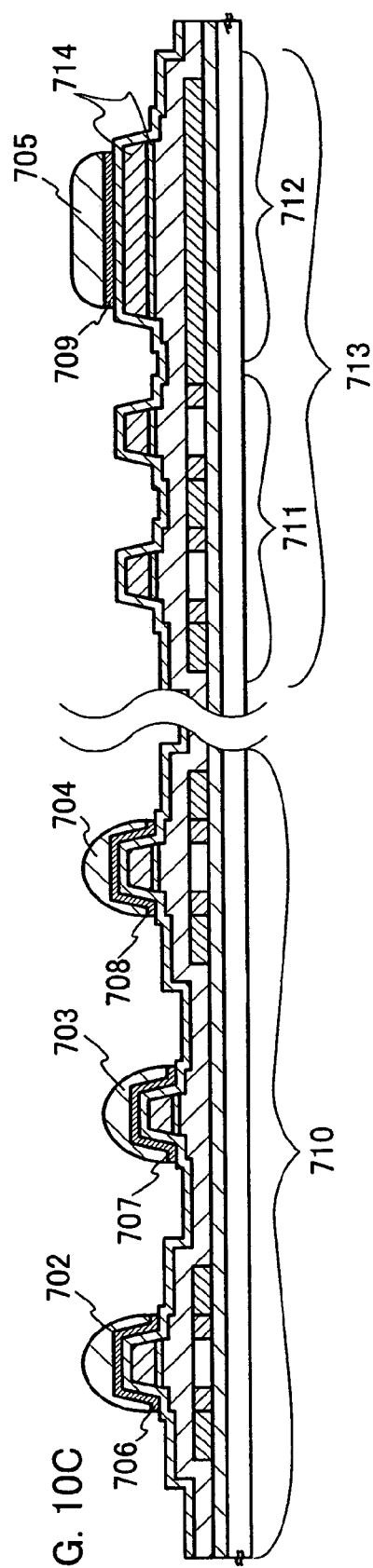

THIN FILM TRANSISTOR, SEMICONDUCTOR DEVICE, AND METHOD FOR MANUFACTURING THE SAME

BACKGROUND OF THE INVENTION

1. Field of the Invention

The present invention relates to a thin film element formed over a glass substrate and to a glass substrate over which a thin film element is formed.

2. Description of the Related Art

A glass substrate, which is low in cost as compared with a quartz substrate and easy to form in large size, has been frequently used as a substrate for a flat panel display and the like.

However, a glass substrate is low in heat distortion temperature and weak of heat, thus there are many restrictions in the process of forming a thin film semiconductor over a glass substrate. In view of this, in the case of forming polysilicon over a glass substrate, a process using laser crystallization is adopted so that the substrate is not heated much.

Nevertheless, the substrate is necessarily heated to a certain degree in order to, for example, activate impurities, thus various countermeasures to alleviate the heat shrink have been devised as disclosed in Patent Document 1 and Patent Document 2.

[Patent Document 1]
  Japanese Patent Laid-Open No. 2002-175984
[Patent Document 2]
  Japanese Patent Laid-Open No. 2003-335547

In accordance with the cost reduction and enlargement of a display size, a glass substrate has gradually been enlarged, thereby causing considerable substrate distortion due to heat shrink. Thus, a further countermeasure is required.

In addition, as a design rule has been diminished, an acceptable margin for mask deviation has been smaller, thereby causing deviation in some cases due to misalignment or substrate distortion even if the mask is aligned with high precision.

In view of the foregoing, the invention provides a semiconductor element where the operation is not affected even when being formed over a substrate which is largely affected by heat shrink such as a large substrate. In addition, the invention provides a thin film semiconductor circuit and a thin film semiconductor device each provided with the semiconductor element.

In addition, according to the invention, a semiconductor element is provided where the operation is not affected even if there is slight mask deviation. Furthermore, the invention provides a thin film semiconductor circuit and a thin film semiconductor device each provided with the semiconductor element.

SUMMARY OF THE INVENTION

According to one aspect of the invention, there is provided a plurality of gate electrodes formed so as to overlap a lower concentration impurity region of a semiconductor layer than drain regions on a drain region side. Also, source regions and the drain regions corresponding to the respective gate electrodes are formed so that current flows in opposite directions each other through channel regions corresponding to the gate electrodes. Further, the number of the channel regions in which a current flows in a first direction is equal to the number of the channel regions in which a current flows in a direction opposite to the first direction.

According to another aspect of the invention, a thin film transistor comprises a plurality of gate electrodes formed over a semiconductor layer, channel regions corresponding to the gate electrodes, and source and drain regions corresponding to the respective gate electrodes formed in the semiconductor layer, which contain one conductivity type impurity element. In addition, the semiconductor layer comprises lower concentration impurity regions than the drain regions at one portions on the drain sides which overlap the gate electrodes. Further, when a direction of a current flowing through one of the channel regions is referred to as a standard direction, the number of the channel regions in which a current flows in the standard direction and the number of the channel regions in which a current flows in a direction opposite to the standard direction are equal.

According to another aspect of the invention, a thin film transistor comprises a plurality of gate electrodes formed over a plurality of semiconductor layers, channel regions corresponding to the gate electrodes, and source and drain regions corresponding to the respective gate electrodes formed in the plurality of semiconductor layers, which contain one conductivity type impurity element. In addition, the plurality of semiconductor layers comprise lower concentration impurity regions than the drain regions at one portions on the drain sides which overlap the gate electrodes. Further, when a direction of a current flowing through one of the channel regions is referred to as a standard direction, the number of the channel regions in which a current flows in the standard direction and the number of the channel regions in which a current flows in a direction opposite to the standard direction are equal.

According to another aspect of the invention, a thin film transistor comprises a even numbers of gate electrodes formed over a semiconductor layer, channel regions corresponding to the respective gate electrodes, and source and drain regions corresponding to the respective gate electrodes formed in the semiconductor layer, which contain a one conductivity type impurity element. In addition, the semiconductor layer comprises lower concentration impurity regions than the drain regions at one portions on the drain sides which overlap the gate electrodes. Further, when a direction of current flowing through one of the channel regions is referred to as a standard direction, the number of the channel regions in which a current flows in the standard direction and the number of the channel regions in which a current flows in a direction opposite to the standard direction are equal.

According to another aspect of the invention, a semiconductor device is provided which comprises a first transistor and a second transistor, wherein the first transistor and the second transistor each comprises a semiconductor layer, a gate insulating film for covering the semiconductor layer and a gate electrode formed over the gate insulating film. Further, the semiconductor layer is doped with a p-type or an n-type impurity element. Moreover, a source region of the first transistor and a source region of the second transistor are electrically connected each other. In the same manner, drain regions and the gate electrodes are electrically connected each other in the two transistors. In addition, the semiconductor layer over which the gate electrode is formed comprises at least a channel region and a lower concentration impurity region than the drain region. Additionally, a current flows in the two transistors in parallel directions to each other, the width of the respective gate electrodes of the two transistors are equal, a part of a semiconductor layer which overlaps the gate electrode has the same shape between the two transistors, and current flows through the two transistors in opposite directions to each other.

According to another aspect of the invention, a semiconductor device is provided which comprises a first transistor and a second transistor, and the first transistor and the second transistor each comprises a semiconductor layer, a gate insulating film for covering the semiconductor layer and a gate electrode formed over the gate insulating film. Further, the semiconductor layer is doped with a p-type or an n-type impurity element at a first concentration. In addition, the semiconductor layer over which the gate electrode is formed comprises at least a channel region and a lower concentration impurity region than the first concentration region. Moreover, both the two transistors are input from a first wiring and output to a second wiring, and respective gate electrodes are electrically connected between the two transistors. Additionally, a current flows through the two transistors in parallel directions to each other, the width of the respective gate electrodes of the two transistors are equal, a portion of the semiconductor layer which overlaps the gate electrode has the same shape between the two transistors, and current flows through the two transistors in opposite directions to each other.

According to another aspect of the invention, a semiconductor device is provided which comprises a first transistor and a second transistor, and the first transistor and the second transistor each comprises a semiconductor layer, a gate insulating film for covering the semiconductor layer and a gate electrode formed over the gate insulating film. Further, the semiconductor layer is doped with a p-type or an n-type impurity element at a first concentration. In addition, the semiconductor layer over which the gate electrode is formed comprises at least a channel region and a lower concentration impurity region than the first concentration region. Moreover, parasitic capacitance between a source region and the gate electrode of the first transistor is equal to parasitic capacitance between a drain region and the gate electrode of the second transistor. Additionally, a current flows through the two transistors in parallel directions to each other, the width of the respective gate electrodes of the two transistors are equal, a portion of the semiconductor layer which overlaps the gate electrode has the same shape between the two transistors, and a current flows through the two transistors in opposite directions to each other.

According to another aspect of the invention, a transistor is provided which comprises a plurality of transistors each comprises a semiconductor layer, an insulating film and a gate electrode, and the gate electrodes of the plurality of transistors are electrically connected to each other, each of the gate electrode comprises a first-layer gate electrode and a second-layer gate electrode, drain regions of the plurality of transistors are electrically connected to each other, source regions of the plurality of transistors are electrically connected to each other, the plurality of transistors comprises a transistor including a channel through which a current flows in a first direction and a transistor including a channel through which current flows in a second direction that is opposite to the first direction.

According to another aspect of the invention, a transistor having the above-described structure comprises the semiconductor layer shared between the plurality of transistors.

According to another aspect of the invention, a transistor having the above-described structure comprises the semiconductor layer which is different among the plurality of transistors.

According to another aspect of the invention, a transistor having the above-described structure comprises the source region and the drain region which are added with an n-type or a p-type impurity element at a first concentration.

According to another aspect of the invention, a transistor having the above-described structure comprises a portion of the semiconductor layer which overlaps only the second-layer gate electrode is added with one impurity element as that of the source region and the drain region at a lower concentration than the first concentration.

According to another aspect of the invention, a transistor having the above-described structure characterized in that the number of the transistors through which current flows in the first direction and the number of the transistors through which current flows in the second direction are equal in the plurality of transistors, and the width of the semiconductor layers each of which overlaps the second-layer gate electrode and in a direction perpendicular to the first direction or the second direction in a plane parallel to a surface of the substrate is equal in the plurality of transistors.

According to another aspect of the invention, a transistor having the above-described structure has a first portion where the semiconductor layer through which current flows in the first direction overlaps the second-layer gate electrode. Further, the transistor has a second portion where the semiconductor layer through which current flows in the second direction overlaps the second-layer gate electrode. A total width of the first portions of a plurality of the transistors in a direction perpendicular to the first direction in a plane parallel to a surface of the substrate is equal to a total width of the second portions of a plurality of the transistors in a direction perpendicular to the first direction in a plane parallel to a surface of the substrate.

According to another aspect of the invention, a transistor is provided which comprises a first transistor having a first semiconductor layer, a gate insulating film and a first gate electrode and a second transistor having a second semiconductor layer, the gate insulating film and a second gate electrode. In addition, the first gate electrode and the second gate electrode are electrically connected to each other, and the first gate electrode and the second gate electrode are each comprises a first-layer gate electrode and a second-layer gate electrode. Additionally, a drain region of the first transistor and a drain region of the second transistor are electrically connected to each other, a source region of the first transistor and a source region of the second transistor are electrically connected to each other, and current flows through channels in the first transistor and the second transistor in opposite directions to each other.

According to another aspect of the invention, a transistor having the above-described structure has the source region and the drain region added with an n-type or a p-type impurity element at a first concentration.

According to another aspect of the invention, a transistor having the above-described structure has the first semiconductor layer which overlaps the second-layer gate electrode of the first gate electrode but does not overlap the first-layer gate electrode of the first gate electrode is added with the same impurity element as that of the source region and the drain region at a lower concentration than the first concentration, and the second semiconductor layer which overlaps the second-layer gate electrode of the second gate electrode but does not overlap the first-layer gate electrode of the second gate electrode is added with the same impurity element as that of the source region and the drain region at a lower concentration than the first concentration.

According to another aspect of the invention, in a transistor having the above-described structure, when the width means the length in a direction perpendicular to a direction of flowing carriers through channels of the first transistor and the second transistor in a plane parallel to a surface of the substrate, the width of the first semiconductor layer which overlaps the first gate electrode is equal to the width of the second semiconductor layer which overlaps the second gate electrode.

According to another aspect of the invention, a transistor having the above-described structure is provided which comprises a first transistor having a semiconductor layer, a gate insulating film and a first gate electrode and a second transistor having the semiconductor layer, the gate insulating film and a second gate electrode. In addition, the first gate electrode and the second gate electrode are electrically connected to each other, each of the first gate electrode and the second gate electrode comprises a first-layer gate electrode and a second-layer gate electrode. Additionally, a drain region of the first transistor and a drain region of the second transistor are electrically connected to each other, a source region of the first transistor and a source region of the second transistor are electrically connected to each other, and current flows through channels in the first transistor and the second transistor in opposite directions to each other.

According to another aspect of the invention, a transistor having the above-described structure has the source region and the drain region added with an n-type or a p-type impurity element at a first concentration.

According to another aspect of the invention, a transistor having the above-described structure has the semiconductor layer which overlaps the second-layer gate electrode of the first gate electrode but does not overlap the first-layer gate electrode of the first gate electrode is added with the same impurity element as that of the source region and the drain region at a lower concentration than the first concentration, and the semiconductor layer which overlaps the second-layer gate electrode of the second gate electrode but does not overlap the first-layer gate electrode of the second gate electrode is added with the same impurity element as that of the source region and the drain region at a lower concentration than the first concentration.

According to another aspect of the invention, in a transistor having the above-described structure, when the width means the length in a direction perpendicular to a direction of flowing carriers through channels of the first transistor and the second transistor in a plane parallel to a surface of the substrate, the width of the semiconductor layer which overlaps the first gate electrode is equal to the width of the semiconductor layer which overlaps the second gate electrode.

A method for forming a thin film transistor according to one aspect of the invention comprises the steps of forming a plurality of semiconductor layers over a substrate so as to be parallel each other, forming a gate insulating film so as to cover the plurality of semiconductor layers, forming first-layer gate electrodes which are electrically connected correspondingly to the plurality of semiconductor layers, adding a p-type or an n-type impurity at a first concentration to the plurality of semiconductor layers by using the first-layer gate electrodes as masks, activating the impurity added to the plurality of semiconductor layers by heat treatment, forming respective second-layer gate electrodes correspondingly to the plurality of first-layer gate electrodes so as to cover the plurality of semiconductor layers partially and the first-layer gate electrodes, adding the impurity added to the plurality of semiconductor layers by using the second-layer gate electrodes as masks so that a source region and a drain region are formed in each of the plurality of semiconductor layers to which the impurity is added at a higher concentration than the first concentration, forming an interlayer insulating film so as to cover the plurality of semiconductor layers, the second-layer gate electrodes and the gate insulating film, forming contact holes in the interlayer insulating film to reach each of the source regions and the drain regions, forming a conductive film over the interlayer insulating film, and performing patterning and etching to form a wiring, a source electrode which are electrically connected between the source regions of the plurality of semiconductor layers each other through the contact holes, and a drain electrode which are electrically connected between the drain regions of the plurality of semiconductor layers through the contact holes. In addition, the source regions and the drain regions of the plurality of semiconductor layers are arranged so as to be a first arrangement in which one of the source region is disposed on the right side of the second-layer gate electrode or a second arrangement in which one of the source region is disposed on the left side of the second-layer gate electrode, and the first arrangement and the second arrangement are equal in number in the plurality of semiconductor layers. Additionally, a portion of the semiconductor layer which overlaps the second-layer gate electrode has the same shape among the plurality of semiconductor layers.

A method for forming a thin film transistor according to the invention comprises the steps of forming a semiconductor layer over a substrate, forming a gate insulating film so as to cover the semiconductor layer, forming a plurality of first-layer gate electrodes which are electrically connected to each other on the semiconductor layer, adding a p-type or an n-type impurity at a first concentration to the plurality of semiconductor layer by using the first-layer gate electrodes as masks, activating the impurity added to the semiconductor layer by heat treatment, forming respective second-layer gate electrodes correspondingly to the plurality of first-layer gate electrodes so as to cover the semiconductor layer partially and the first-layer gate electrodes, adding the impurity added to the semiconductor layer by using the second-layer gate electrodes as masks so that a source region and a drain region are formed in the semiconductor layer to which the impurity is added at a higher concentration than the first concentration, forming an interlayer insulating film so as to cover the semiconductor layer, the second-layer gate electrodes and the gate insulating film, forming contact holes in the interlayer insulating film to reach each of the source regions and the drain regions, forming a conductive film over the interlayer insulating film so as to fill the contact holes, and performing patterning and etching the conductive film to form a wiring, a source electrode for connecting electrically to the source regions each other, and a drain electrode for connecting electrically to the drain regions each other. In addition, the source regions and the drain regions of the semiconductor layer are arranged so as to be a first arrangement in which one of the source regions is located on the right side of the second-layer gate electrode or a second arrangement in which one of the source region is located on the left side of the second-layer gate electrode, and the first arrangement and the second arrangement are equal in number in the semiconductor layer. Additionally, a portion of the semiconductor layer which overlaps the second-layer gate electrode has the same shape in the semiconductor layer.

A method for forming a thin film transistor according to the invention comprises the steps of forming a first semiconductor layer and a second semiconductor layer over a substrate, forming a gate insulating film so as to cover the first semiconductor layer and the second semiconductor layer, forming a first first-layer gate electrode to overlap the first semiconductor layer and a second first-layer gate electrode to overlap the second semiconductor layer over the gate insulating film, adding a p-type or an n-type impurity at a first concentration to the first semiconductor layer and the second semiconductor layer by using the first-layer gate electrodes as masks, activating the impurity added to the first semiconductor layer and the second semiconductor layer by heat treatment, forming a first second-layer gate electrode correspondingly to the first first-layer gate electrode so as to cover the first semiconductor layer partially and the first first-layer gate electrode, forming a second second-layer gate electrode correspondingly to the second first-layer gate electrode so as to cover the second semiconductor layer partially and the second first-layer gate electrode, adding the impurity added to the semiconductor layer by using the second-layer gate electrode as a mask so that source regions and drain regions are formed in the first semiconductor layer and the second semiconductor layer to which the impurity is added at a higher concentration than the first concentration, forming an interlayer insulating film so as to cover the first semiconductor layer, second semiconductor layer, the first second-layer gate electrode, and second second-layer gate electrode, forming contact holes in the interlayer insulating film to reach each of the source regions and the drain regions, forming a conductive film over the interlayer insulating film so as to fill the contact holes, and performing patterning and etching the conductive film to form a wiring, a source electrode for connecting electrically to the source regions each other, and a drain electrode for connecting electrically to the drain regions each other. In addition, when the gate electrode is regarded as the middle, the source regions and the drain regions of the first semiconductor layer are arranged oppositely to the source regions and the drain regions of the second semiconductor layer. Additionally, the first first-layer gate electrode and the second first-layer gate electrode are electrically connected to each other, and a portion of the semiconductor layer which overlaps the second-layer gate electrode has the same shape between the first semiconductor layer and the second semiconductor layer.

The invention may suppress a variation in parasitic capacitance of a transistor due to heat shrink of a substrate and misalignment of a mask.

According to another aspect of the invention, a transistor comprises a first semiconductor island, a second semiconductor island, a first gate electrode over the first semiconductor island interposed an insulating film therebetween, and a second gate electrode over the second semiconductor island interposed the insulating film therebetween. In addition, the first semiconductor island comprises a first source region, a first drain region, a first channel region between the first source region and the first drain region, and the second semiconductor island comprises a second source region, a second drain region, a second channel region between the second source region and the second drain region. Additionally, the first source region and the second source region are electrically connected to each other, the first drain region and the second drain region are electrically connected to each other, and a first current flow direction through the first channel region of the first semiconductor island is opposite to a second current flow direction through the second channel region of the second semiconductor island. Further, each of the first gate electrode and the second gate electrode may comprise a first layer and a second layer.

According to another aspect of the invention, a transistor comprises a semiconductor layer, a first gate electrode over the semiconductor layer interposed an insulating film therebetween, and a second gate electrode over the semiconductor layer interposed the insulating film therebetween. In addition, the semiconductor layer comprises a first source region, a second source region, a drain region, a first channel region between the first source region and the drain region, and a second channel region between the second source region and the drain region. Additionally, the first source region and the second source region are electrically connected to each other, and a first current flow direction through the first channel region of the semiconductor layer is opposite to a second current flow direction through the second channel region of the semiconductor layer. Further, each of the first gate electrode and the second gate electrode may comprise a first layer and a second layer.

According to another aspect of the invention, a transistor comprises a plurality of first semiconductor islands, a plurality of second semiconductor islands, an insulating film, and a gate electrode having a first layer and a second layer. In addition, each of the first semiconductor islands comprises a first source region, a first drain region, a first channel region between the first source region and the first drain region. Additionally, each of the second semiconductor island comprises a second source region, a second drain region, a second channel region between the second source region and the second drain region, and each of the first source region of the plurality of first semiconductor islands and each of the second source region of the plurality of second semiconductor islands are electrically connected to each other. Moreover, each of the first drain region of the plurality of first semiconductor islands and each of the second drain region of the plurality of second semiconductor islands are electrically connected to each other. Furthermore, a first current flow direction through the first channel regions of the respective first semiconductor islands is opposite to a second current flow direction through the second channel regions of the respective second semiconductor islands.

BRIEF DESCRIPTION OF THE DRAWINGS

FIGS. 7A to 7D are diagrams illustrating a manufacturing process of a semiconductor device according to the invention.

FIGS. 8A to 8C are diagrams illustrating a manufacturing process of a semiconductor device according to the invention.

FIGS. 10A to 10C are diagrams illustrating a manufacturing process of a semiconductor device according to the invention.

DETAILED DESCRIPTION OF THE INVENTION

Although the invention will be described by way of Embodiment Modes and with reference to the accompanying drawings, it is to be understood that various changes and modifications will be apparent to those skilled in the art. Therefore, unless such changes and modifications depart from the scope of the invention, they should be construed as being included therein.

Description will be made on a thin film transistor, however, the invention can be applied to another transistor as well as the thin film transistor.

Embodiment Mode 1

Figure 1A:
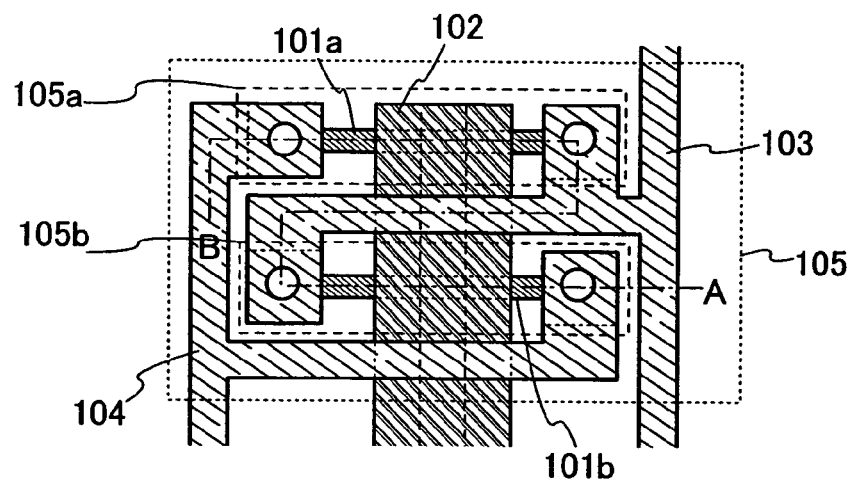
FIGS. 1A and 1B are diagrams illustrating a semiconductor device according to the invention.
Figure 1B:
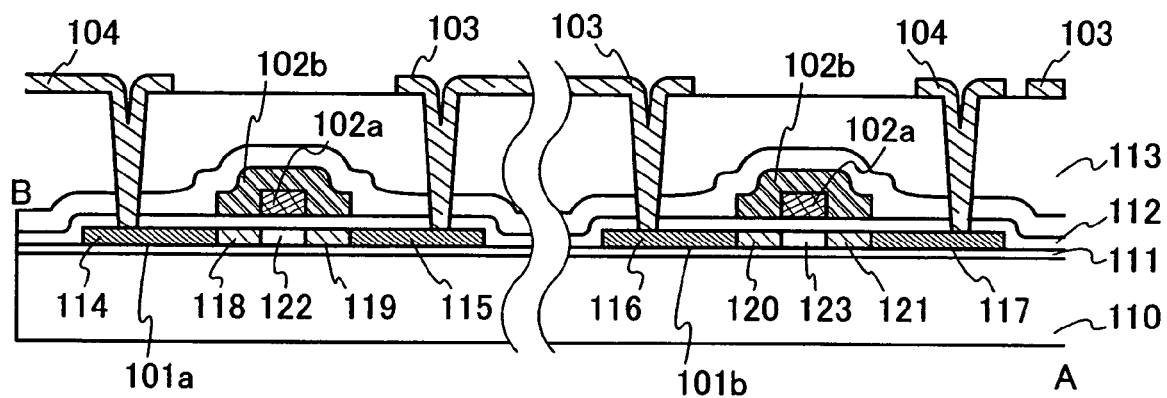

An embodiment mode of the invention is described with reference to FIGS. 1A and 1B. FIG. 1A is a top plan diagram of a semiconductor device according to the invention, which comprises a semiconductor layer 101a, a semiconductor layer 101b, a gate electrode 102, a source electrode and wiring 103, and a drain electrode and wiring 104. FIG. 1B is a cross sectional diagram of FIG. 1A along a line of A-B, which comprises a substrate 110, a base insulating film 111, a gate insulating film 112, and an interlayer insulating film 113. The gate electrode 102 is structured by a first-layer gate electrode 102a and a second-layer gate electrode 102b.

The semiconductor layer 101a and the semiconductor layer 101b are doped with the same impurity of either an n-type or a p-type, which comprise high concentration impurity regions 114 to 117 where the impurity is doped at a high concentration, low concentration impurity regions 118 to 121 where the impurity is doped at a low concentration, and channel regions 122 and 123. The gate electrode 102 overlaps the semiconductor layers 101a and 101b respectively with the gate insulating film 112 interposed therebetween such that the first-layer gate electrode 102a overlaps the channel regions 122 and 123 respectively. The second-layer gate electrode 102b covers the first-layer gate electrode 102a, and at least partially overlaps the low concentration impurity regions 118 to 121 respectively. That is, the low concentration impurity regions 118 to 121 overlap the second-layer gate electrode 102b with the gate insulating film 112 interposed therebetween respectively.

A wiring 103 and a wiring 104 are formed over the interlayer insulating film 113 and electrically connected to the high concentration impurity regions 114 to 117 through a source electrode 103 or a drain electrode 104 respectively both of which are formed at opening portions of the interlayer insulating film 113 to reach the high concentration impurity regions 114 to 117. Note that source electrodes 103a and 103b are connected to the wiring 103 and the high concentration impurity regions (source regions) 115 and 116 respectively, while drain electrodes 104a and 104b are connected to the wiring 104 and the high concentration impurity regions (drain regions) 114 and 117 respectively.

That is, the two thin film transistors are electrically connected between the source regions, between the drain regions, and between the gate electrodes. Both of the two thin film transistors are input from a first wiring and output to a second wiring, and the gate electrodes are electrically connected to each other.

According to the above-described structure, a thin film transistor 105a is formed using the semiconductor layer 101a whereas a thin film transistor 105b is formed using the semiconductor layer 101b, and when a direction of flowing current means a direction of length whereas a direction perpendicular to the direction of length in a plane parallel to a surface of the substrate means a direction of width, the channel regions 122 and 123 are equal to each other in the width and length, and the low concentration impurity regions 118 to 121 are equal to each other in the width. In addition, the semiconductor layers 101a and 101b are arranged parallelly in the direction of length. Note that as for a direction of length and a direction of width, the above definition is adopted in this invention.

In the thin film transistors 105a and 105b, respective source regions, drain regions, source electrodes, and drain electrodes are arranged such that current flows through the thin film transistors 105a and 105b in parallel and opposite directions to each other.

Described above is a thin film transistor according to the invention. A thin film transistor 105 of the invention includes the thin film transistor 105a and the thin film transistor 105b. The thin film transistor 105 has nearly the same property as a thin film transistor of the related art like shown in FIG. 20A (though the width of a channel region 218 of a thin film transistor 205 in FIG. 20A is twice the width of the channel region 122 of the thin film transistor 105a or the channel region 123 of the thin film transistor 105b in FIGS. 1A and 1B, or equal to the total of the width of them.

Figure 20A:
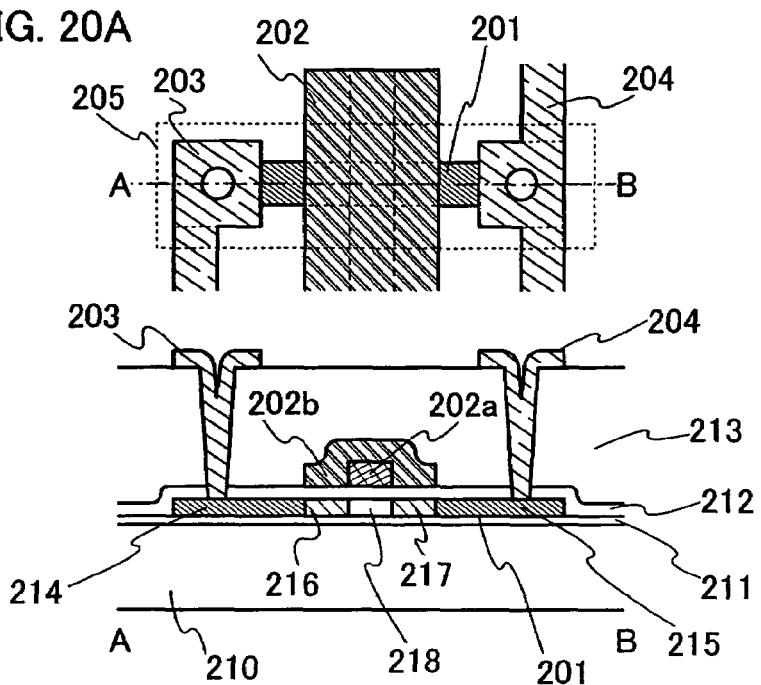
FIGS. 20A to 20C are diagrams each illustrating a semiconductor device of related art.
Figure 20B:
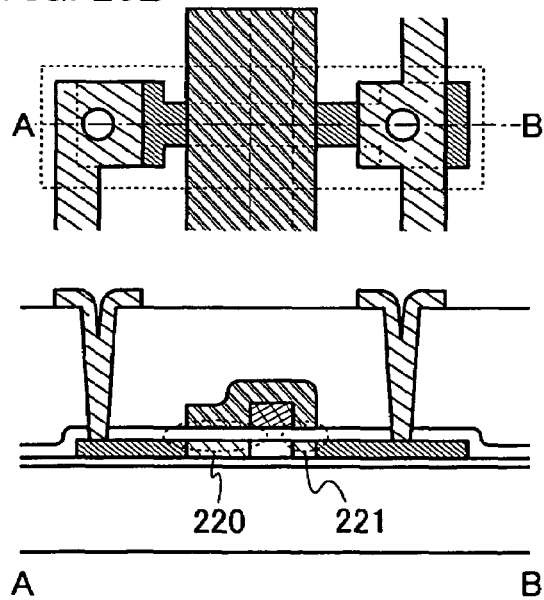
Figure 20C:
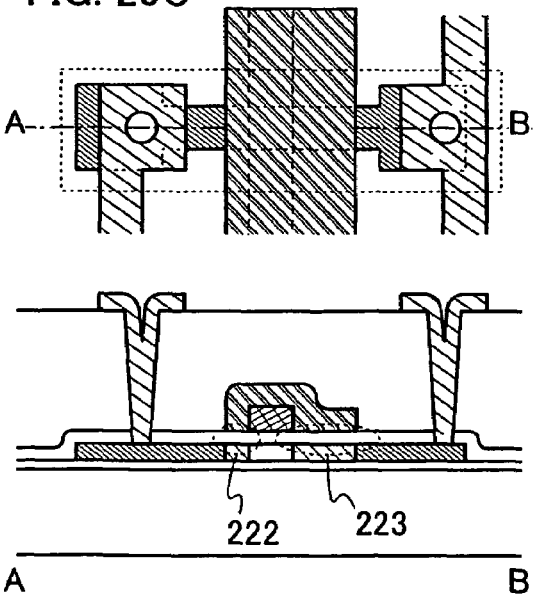

The conventional thin film transistor 205 in FIGS. 20A to 20C comprises a semiconductor layer 201, a gate electrode 202 (a first-layer gate electrode 202a and a second-layer gate electrode 202b), a wiring and source electrode 203, a wiring and drain electrode 204, a substrate 210, a base insulating film 211, a gate insulating film 212, an interlayer insulating film 213, high concentration impurity regions 214 and 215, low concentration impurity regions 216 and 217, and a channel region 218.

Now, in the thin film transistor formed as shown in FIGS. 1A and 1B, or FIGS. 20A to 20C, parasitic capacitance is formed by the low concentration impurity region and the gate electrode. When the second-layer gate electrode 202b of the thin film transistor of the related art as shown in FIG. 20A is formed while being deviated in the direction of length of the semiconductor layer due to some reason (e.g., mask misalignment, distortion, and substrate shrinkage), the area occupied by 220 to 223 (Gate Overlapped Lightly doped Drain regions: GOLD regions) each where the low concentration impurity region and the second-layer gate electrode 202b are overlapped becomes different from the designed area. As the area where the low concentration impurity region and the second-layer gate electrode 202b are overlapped becomes different, the parasitic capacitance is changed in value as well, thereby causing a problem in such that a circuit using the thin film transistor becomes different in circuit load and has a narrower operation margin.

In the case of mask deviation due to heat shrink of a substrate, in particular, the substrate shrinks toward its center, thereby shrinking in different directions between at both ends of the substrate. Consequently, parasitic capacitance on a drain side is considered to be large at one end of the substrate whereas small at the other end. Therefore, the parasitic capacitance of a thin film transistor may be varied in property between at both the ends of the substrate, though which is normally required to be the same. This phenomenon appears remarkably to be a problem particularly in a large substrate and the like. Furthermore, in a source driver or a gate driver of a display device each of which is formed by repeating the same pattern, a circuit operation thereof largely varies between at both the ends of the substrate when the parasitic capacitance varies.

On the other hand, the thin film transistor 105 (FIGS. 1A and 1B) of the invention is described. Here, it is assumed that the thin film transistor 105 according to the invention is formed with the second-layer gate electrode 102b deviated in the direction of length as is shown in FIGS. 20B and 20C (FIGS. 2A and 2B).

Figure 2A:
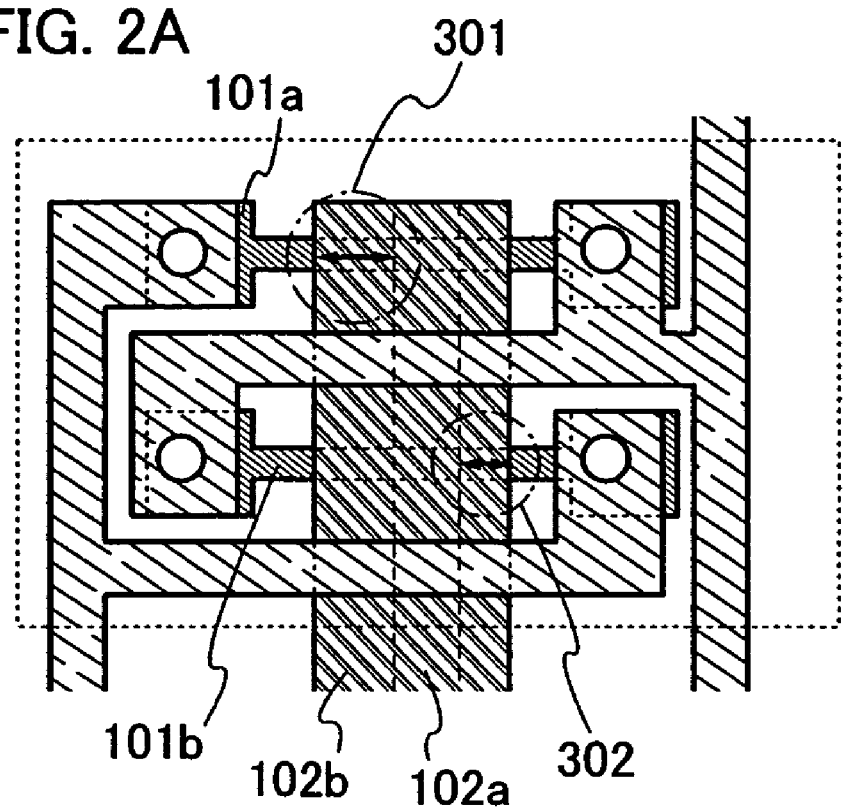
FIGS. 2A and 2B are diagrams each illustrating a semiconductor device according to the invention.

In FIG. 2A, the second-layer gate electrode 102b is deviated leftward from the normal position when is seen the drawing from the front. In the two thin film transistors 105a and 105b which structure the thin film transistor 105 of the invention, a source region and a drain region are located oppositely between for the channel region 122 and for the channel region 123. Therefore, by the leftward deviation of the second-layer gate electrode 102b, the area of the second-layer gate electrode 102b which overlaps a semiconductor layer on a drain side becomes larger in the thin film transistor 105a whereas the area becomes smaller in the thin film transistor 105b.

In addition, the thin film transistors 105a and 105b are arranged such that current flows through the respective channels in opposite directions to each other, and the width of the semiconductor layers 101a and 101b are equal to each other. Therefore, the area increase of the second-layer gate electrode 102b on the drain side in the thin film transistor 105a is equal to the area decrease of the second-layer gate electrode 102b on the drain side in the thin film transistor 105b. In addition, the capacitance varies in accordance with the area variation where the impurity region and the second-layer gate electrode 102b are overlapped with each other. Therefore, the variation of the parasitic capacitance due to the GOLD region is 0 in the thin film transistor 105 of the invention which is structured by the two thin film transistors 105a and 105b. That is, the thin film transistor 105 according to the invention may be less affected by capacitance variation due to mask deviation.

Figure 2B:
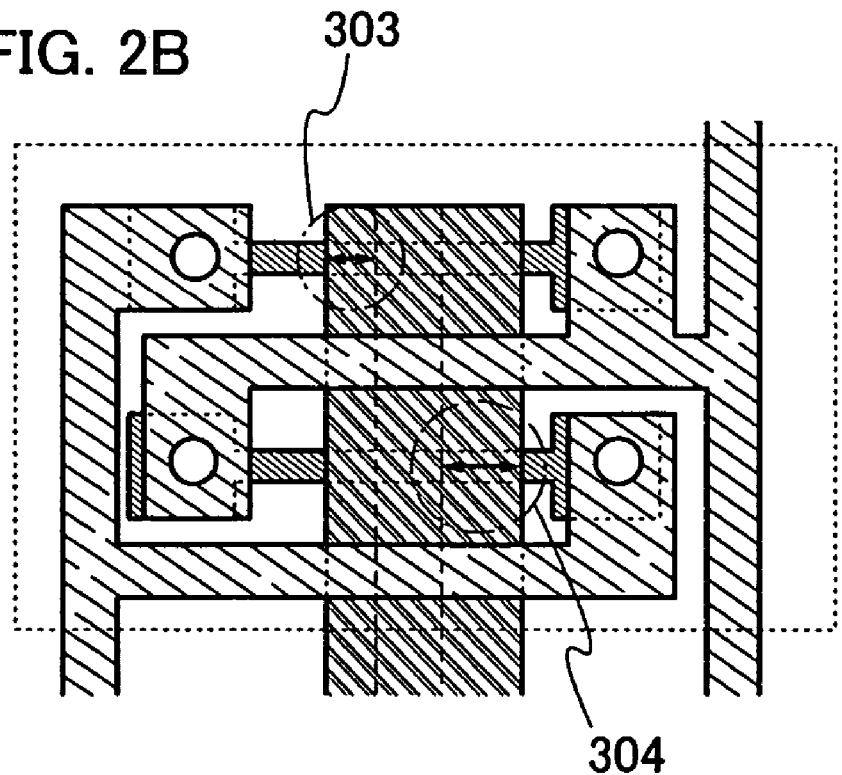

In FIG. 2B, the second-layer gate electrode 102b is formed with positional deviation in a direction opposite to that in FIG. 2A (rightward when is seen the drawing from the front). The area of a GOLD region 303 becomes smaller in the thin film transistor 105a whereas the area of a GOLD region 304 becomes larger in the thin film transistor 105b here. In this case also, the total capacitance variation results in 0. Description thereof is the same as in FIG. 2A, and is thus omitted here.

That is, the area increase of a GOLD region 301 in the thin film transistor 105a having the semiconductor layer 101a as the active layer is equal to the area decrease of a GOLD region 302 in the thin film transistor 105b having the semiconductor layer 101b as the active layer, thereby the total variation is balanced out to be 0. The same applies to the capacitance on the source side. In this manner, the thin film transistor according to the invention may be less affected by capacitance variation of the GOLD region that is caused by mask deviation due to mask misalignment, distortion, substrate shrinkage, and the like. Accordingly, parasitic capacitance of the thin film transistor is less varied, and circuit load of a circuit formed using the thin film transistor may be less varied as well.

Accordingly, a semiconductor element may be provided where the operation is not affected even when being formed over a substrate which is largely affected by heat shrink such as a large substrate. In addition, a thin film semiconductor circuit and a thin film semiconductor device may be provided each provided with the semiconductor element.

In addition, a semiconductor element may be provided where the operation is not affected even if there is slight mask deviation. Furthermore, a thin film semiconductor circuit and a thin film semiconductor device may be provided each provided with the semiconductor element.

In addition, it is preferable that the direction of length be set along the direction in which the same patterns are aligned, in which case a circuit having few variations of circuit load may be formed by arranging the thin film transistors of the invention.

Note that in this embodiment mode, two gate electrodes are provided for one thin film transistor, however, more number of gate electrodes may be provided, and desirably an even number of gate electrodes are provided. At the same time, it is preferable that current flow through respective channels in semiconductor layers correspondingly to the gate electrodes in a first direction or a second direction opposite to the first direction, and the number of the channels for flowing current in the first direction be as close as possible to the number of the channels for flowing current in the second direction. That is, it is preferable that, as for the number of the channels for flowing current in the first direction and the number of the channels for flowing current in the second direction in a transistor, the respective numbers of the channels be different by one when an odd number of channels is formed or they be equal to each other when an even number of channels is formed.

Note that deviation in the direction of width does not affect much in the case of such slight mask deviation as to be supposed in the invention, because a margin for deviation in the direction of width is larger than that for deviation in the direction of length.

Embodiment Mode 2

Figure 3A:
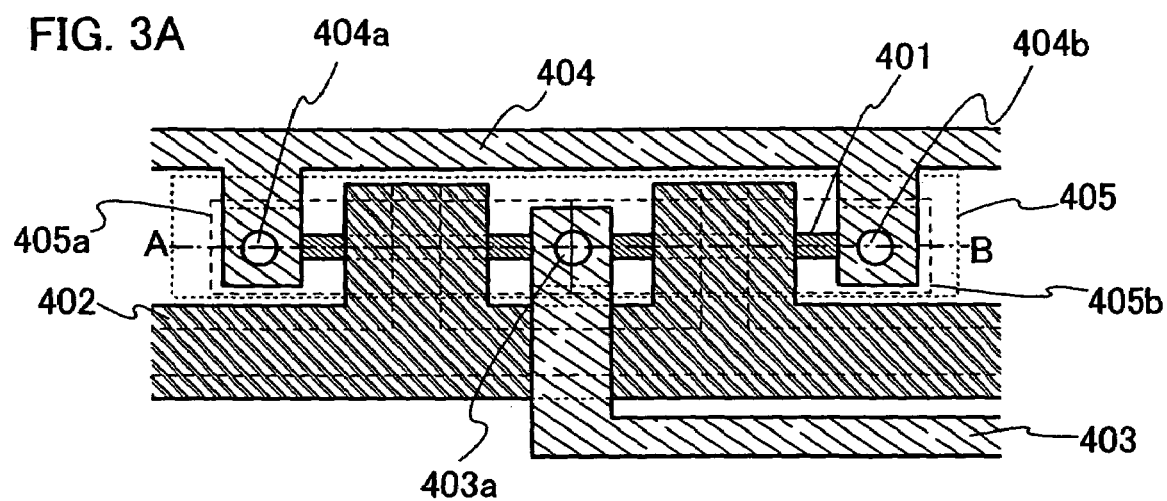
FIGS. 3A and 3B are diagrams illustrating a semiconductor device according to the invention.

An embodiment mode of a transistor according to the invention which differs from Embodiment Mode 1 is described with reference to FIGS. 3A and 3B. FIG. 3A is a top plan diagram of a thin film transistor 405 according to the invention, which comprises a semiconductor layer 401, a gate electrode 402, a drain electrode and wiring (including a drain electrode 403a) 403, and a source electrode and wiring (including source electrodes 404a and 404b) 404. The thin film transistor 405 is structured by a thin film transistor 405a comprising the source electrode 404a and the drain electrode 403a, and a thin film transistor 405b comprising the source electrode 404b and the drain electrode 403a.

Figure 3B:
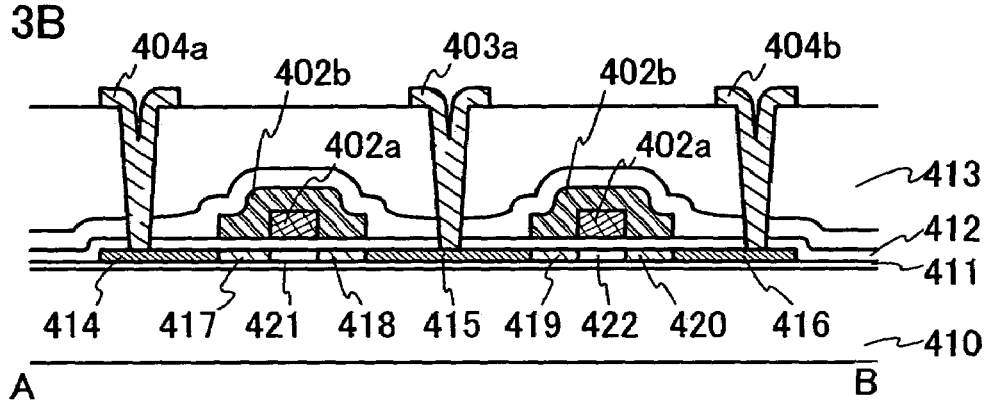

FIG. 3B is a cross sectional diagram of FIG. 3A along a line of A-B, which comprises a first-layer gate electrode 402a, a second-layer gate electrode 402b, a substrate 410, a base insulating film 411, a gate insulating film 412, an interlayer insulating film 413, high concentration impurity regions 414 to 416, low concentration impurity regions 417 to 420, and channel regions 421 and 422. The gate electrode is structured by the first-layer gate electrode 402a and the second-layer gate electrode 402b. In addition, the width of respective gate electrodes which overlap the semiconductor layer 401 is overlapped is equal to each other between in the thin film transistor 405a and in the thin film transistor 405b. Other reference numerals in FIG. 3B are identical to those in FIG. 3A, thus description thereof is omitted here.

In the thin film transistor 405 in this embodiment mode, the semiconductor layer 401 corresponds to the semiconductor layers 101a and 101b in Embodiment Mode 1, while the thin film transistors 405a and 405b correspond to the thin film transistors 105a and 105b. The thin film transistor 405 in this embodiment mode is provided with the semiconductor layer 401 in continuity, that is different from the thin film transistor 105 in FIGS. 1A and 1B. Current flows through the thin film transistors 405a and 405b which structure the thin film transistor 405 in parallel and opposite directions to each other.

Therefore, even if the second-layer gate electrode 402b is formed with positional deviation due to some reason, the area variation of the second-layer gate electrode 402b on the drain side in the thin film transistor 405a is equal to the area variation of the second-layer gate electrode 402b on the source side in the thin film transistor 405b. The capacitance varies in accordance with the area variation where the impurity region and the gate electrode are overlapped with each other. Therefore, the variation of the parasitic capacitance is 0 in the thin film transistor 405 of the invention which is structured by the two thin film transistors 405a and 405b. That is, the thin film transistor 405 according to this embodiment mode has substantially the same structure as the thin film transistor 105 described in Embodiment Mode 1, which may be less affected by capacitance variation due to mask deviation.

Figure 4:
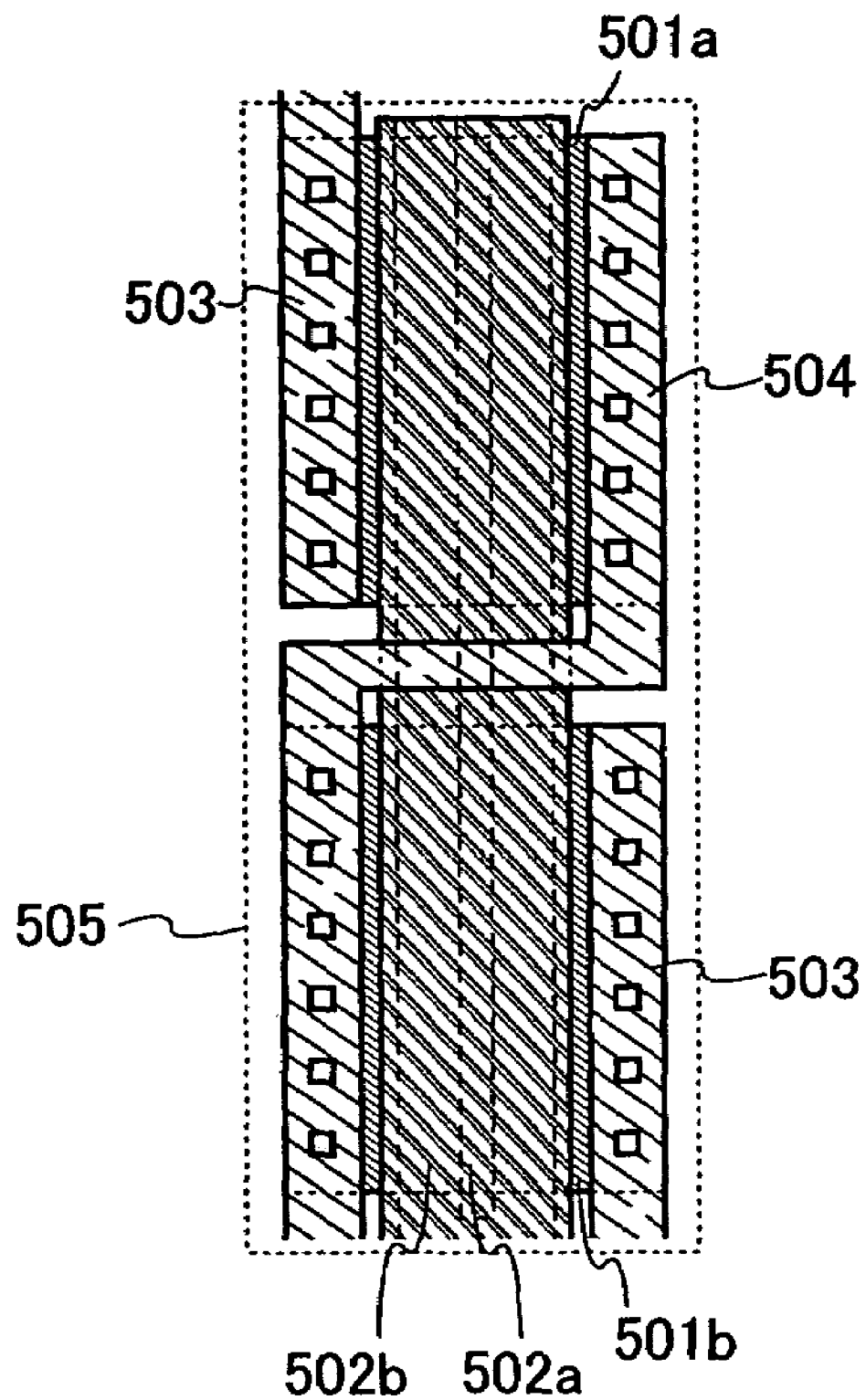
FIG. 4 is a diagram illustrating a semiconductor device according to the invention.

FIG. 4 is different from that described in Embodiment Mode 1 in appearance, though, which comprises semiconductor layers 501a and 501b, a first-layer gate electrode 502a, a second-layer gate electrode 502b, a drain electrode and wiring 503, and a source electrode and wiring 504 for jointly forming a thin film transistor 505. A gate electrode is structured by the first-layer gate electrode 502a and the second-layer gate electrode 502b. The thin film transistor 505 has the same structure as that described in Embodiment Mode 1, provided that drain electrodes 503 are connected to the common wiring, the gate electrode is structured by two layers, and a channel region is formed where both of the first-layer gate electrode 502a and the second-layer gate electrode 502b overlap, a low concentration impurity region is formed where only the second-layer gate electrode 502b overlaps, and the rest of the region is a high concentration impurity region respectively in the semiconductor layers 501a and 501b. In this manner, even if the layout seems different, the structure of the invention may be applied and a similar effect can be obtained.

Accordingly, a semiconductor element may be provided where the operation is not affected even when being formed over a substrate which is largely affected by heat shrink such as a large substrate. In addition, a thin film semiconductor circuit and a thin film semiconductor device may be provided each provided with the semiconductor element.

In addition, a semiconductor element may be provided where the operation is not affected even if there is slight mask deviation. Furthermore, a thin film semiconductor circuit and a thin film semiconductor device may be provided each provided with the semiconductor element.

In addition, it is preferable that the direction of length be set along the direction in which the same patterns are aligned, in which case a circuit having few variations of circuit load can be formed by arranging the thin film transistors of the invention.

Note that in this embodiment mode, two gate electrodes are provided for one thin film transistor, however, more number of gate electrodes may be provided, and desirably an even number of gate electrodes are provided. At the same time, it is preferable that current flow through respective channels in semiconductor layers correspondingly to the gate electrodes in a first direction or a second direction opposite to the first direction, and the number of the channels for flowing current in the first direction be as close as possible to the number of the channels for flowing current in the second direction. That is, it is preferable that, as for the number of the channels for flowing current in the first direction and the number of the channels for flowing current in the second direction in a transistor, the respective numbers of the channels be different by one when an odd number of channels is formed or they be equal to each other when an even number of channels is formed.

Embodiment Mode 3

Figure 23:
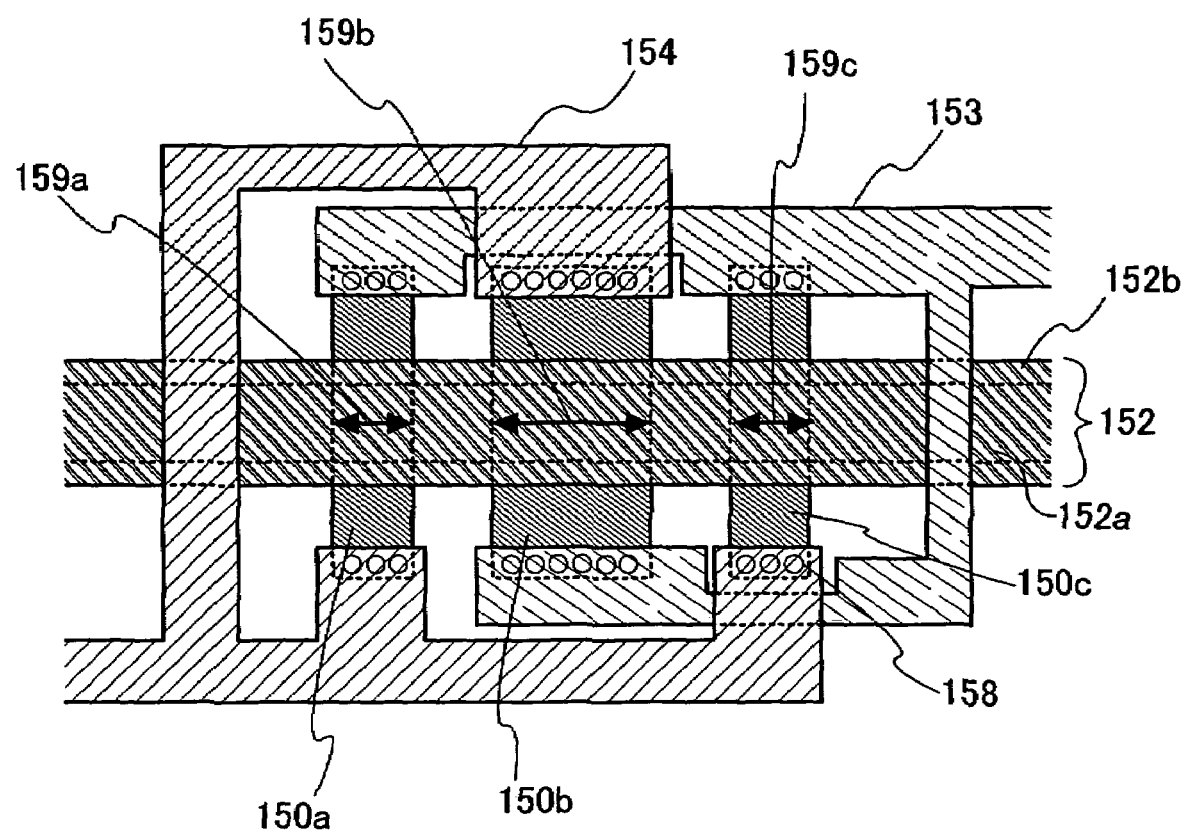
FIG. 23 is a diagram illustrating a semiconductor device according to the invention.

An embodiment mode of a transistor according to the invention which differs from Embodiment Mode 1 and Embodiment Mode 2 is described with reference to FIG. 23. FIG. 23 is a top plan diagram of a transistor 151 according to the invention, which comprises semiconductor layers 150a, 150b and 150c, a gate electrode 152 (structured by a first-layer gate electrode 152a and a second-layer gate electrode 152b), a drain electrode and wiring 154, and a source electrode and wiring 153. The transistor 151 is structured by a transistor comprising the semiconductor layer 150a, a transistor comprising the semiconductor layer 150b, and a transistor comprising the semiconductor layer 150c.

In the semiconductor layers 150a to 150c respectively, a region which overlaps the first-layer gate electrode 152a is substantially added with neither an n-type nor a p-type impurity, a region which overlaps only the second-layer gate electrode 152b is added with the impurity at a low concentration, and the rest of the region is added with the impurity at a high concentration.

The common source electrode and wiring 153, and the common drain electrode and wiring 154 are connected to these three transistors respectively through contact holes, and when current flows through the transistor comprising the semiconductor layer 150a in a first direction, current flows through the transistor comprising the semiconductor layer 150b in a second direction that is parallel and opposite to the first direction, and current flows through the transistor comprising the semiconductor layer 150c in the first direction. The total width of a width 159a of the semiconductor layer 150a where the gate electrode 152 is overlapped and a width 159c of the semiconductor layer 150c where the gate electrode 152 is overlapped is equal to a width 159b of the semiconductor layer 150b where the gate electrode 152 is overlapped.

Accordingly, even if the second-layer gate electrode 152b is formed with positional deviation in the direction of length due to some reason, the total increase (decrease) of the area of the semiconductor layer 150a which overlaps only the second-layer gate electrode 152b on the drain side in the transistor comprising the semiconductor layer 150a and the area of the semiconductor layer 150c which overlaps only the second-layer gate electrode 152b on the drain side in the transistor comprising the semiconductor layer 150c is equal to the area decrease (increase) of the second-layer gate electrode 152b on the drain side in the transistor comprising the semiconductor layer 150b. The capacitance varies in accordance with the area variation where the impurity region and the gate electrode are overlapped with each other. Therefore, the variation of the parasitic capacitance is 0 in the thin film transistor 151 of the invention which is structured by the three transistors. That is, the thin film transistor 151 according to this embodiment mode has substantially the same structure as the thin film transistor 105 described in Embodiment Mode 1, which may be less affected by capacitance variation due to mask deviation.

Accordingly, a semiconductor element may be provided where the operation is not affected even when being formed over a substrate which is largely affected by heat shrink such as a large substrate. In addition, a thin film semiconductor circuit and a thin film semiconductor device may be provided each provided with the semiconductor element.

In addition, a semiconductor element may be provided where the operation is not affected even if there is slight mask deviation. Furthermore, a thin film semiconductor circuit and a thin film semiconductor device may be provided each provided with the semiconductor element.

In addition, it is preferable that the direction of length be set along the direction in which the same patterns are aligned, in which case a circuit having few variations of circuit load can be formed by arranging the thin film transistors of the invention.

Note that in this embodiment mode, the transistor 151 according to the invention is structured by three transistors, however, the invention is not limited to this and the number of transistors for structuring the transistor of the invention is not restricted, as long as the transistors are electrically connected between the source regions, between the drain regions and between the gate electrodes, and the width of the semiconductor layer which overlaps the gate electrode in the transistor through which channel current flows in the first direction is equal in total to the width of the semiconductor layer which overlaps the gate electrode is overlapped in the transistor through which channel current flows in the second direction that is parallel and opposite to the first direction.

Embodiment 1

This embodiment describes an inverter circuit employing a bootstrap method as an example using the thin film transistor according to the invention. Three transistors are denoted by Tr1, Tr2 and Tr3 respectively, a capacitor is denoted by C1, and parasitic capacitance due to a gate electrode of Tr2 is denoted by C2.

Figure 5:
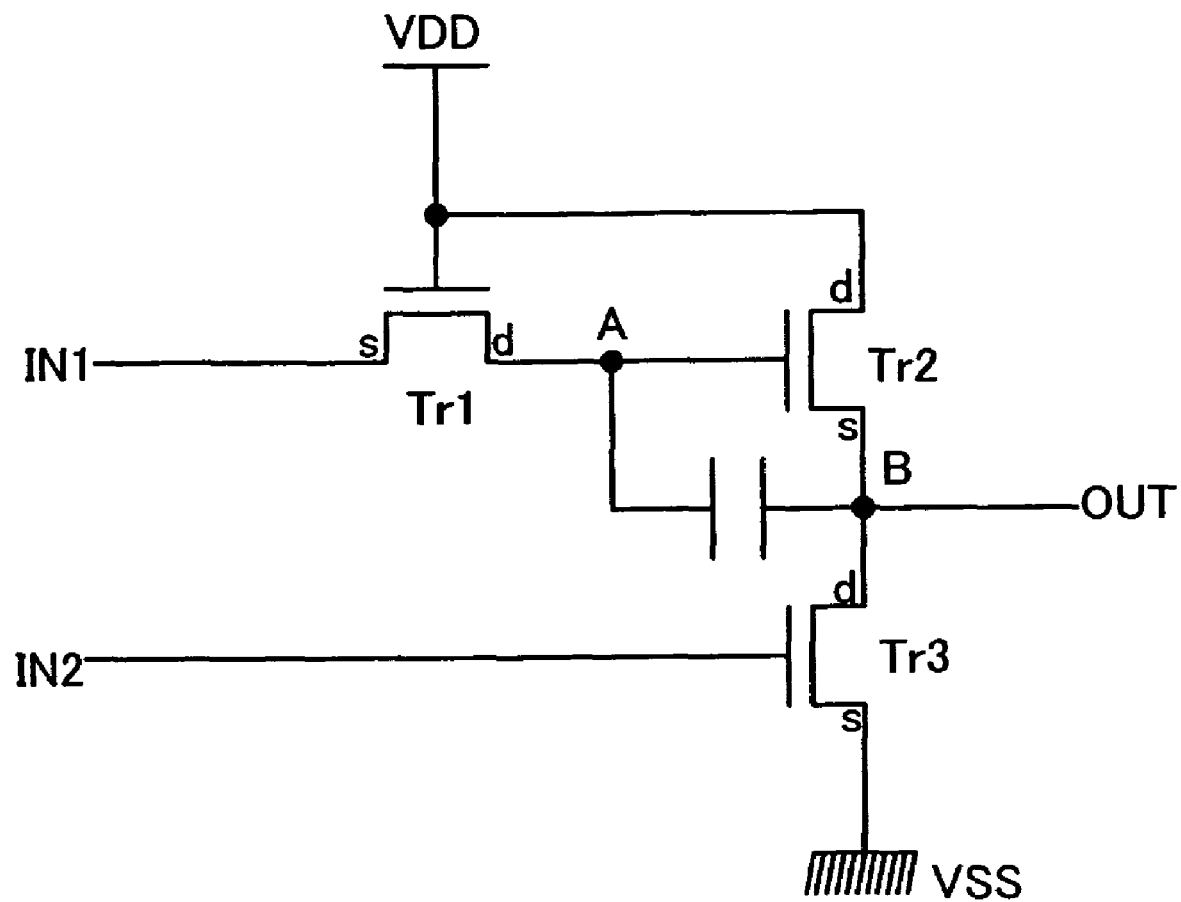
FIG. 5 is a diagram describing an example of a semiconductor device according to the invention.

An equivalent circuit of the inverter circuit employing a bootstrap method is shown in FIG. 5, and an operation thereof is described below. It is assumed that VDD=16 V, VSS=0 V, and a threshold of each of the transistors Vth=3 V here. When IN1 is input with 16 V and IN2 is input with 0 V, Tr1 is turned ON and a potential at a point A is charged up to a voltage that is equal to the input voltage dropped by the threshold of Tr1 (16 V−3 V=13 V in this embodiment). When the potential at the point A reaches 13 V, the Tr1 is turned OFF and the point A becomes the floating state.

Meanwhile, when the point A is charged to exceed the threshold of Tr2 (3 V), Tr2 is turned ON, and then a voltage at a point B is increased as well as an output voltage. After the point A becomes the floating state, when the voltage at the point B is increased, the voltage at the point A is increased due to the capacitance coupling, and a gate voltage of Tr2 is increased as well. When the gate voltage of Tr2 exceeds 19 V (16 V+3 V), an output voltage of Tr2 is 16 V which is equal to an input voltage of Tr2. A voltage increase $\Delta V_A$ at the point A in the floating state is expressed by the following formula, when a voltage increase at the point B is denoted by $\Delta V_B$:

$\Delta V_A = \Delta V_B \times C1/(C1+C2)$. That is, the parasitic capacitance due to the gate electrode of the thin film transistor affects the circuit operation.

In the circuit as described above, if the parasitic capacitance due to the gate electrode of the thin film transistor Tr2 is varied due to some reason (e.g., substrate shrinkage and mask deviation due to misalignment or distortion), the operation is affected. Therefore, an operation margin is required to be set in consideration of this.

However, by using the thin film transistor of the invention for at least Tr2 in the circuit, a variation in parasitic capacitance between the gate electrode and the low concentration impurity region may be suppressed even if there is slight mask deviation. Accordingly, a circuit which is less affected by mask deviation may be formed.

In the case of mask deviation due to heat shrink of a substrate which is caused by heat treatment and the like, in particular, the substrate shrinks toward its center, thereby deviating in different directions depending on the position. When the mask is deviated in various directions, the parasitic capacitance is small at some position whereas it is large at another position, thereby the operation is more largely affected. However, the circuit formed using the thin film transistor of the invention, which may be less affected by this, has a great advantage in securing an operation margin. In this case, when the direction of length of Tr2 which brings a problem by the variation of the parasitic capacitance is set along the direction in which large variations caused by the substrate shrinkage are recognized (that is the direction in which the same patterns are aligned toward a direction of shrinking the substrate), a circuit having few variations of circuit load may be formed.

Accordingly, a thin film semiconductor circuit and a thin film semiconductor device can be provided whose semiconductor element operates without being affected even when being formed over a substrate which is largely affected by heat shrink such as a large substrate.

In addition, a thin film semiconductor circuit and a thin film semiconductor device can be provided where the operation is not affected even if there is slight mask deviation.

This embodiment can be implemented in combination with Embodiment Modes 1 to 3.

Embodiment 2

A forming method of a thin film transistor according to the invention is described using FIGS. 6A to 9C.

First, a base insulating film 11 is formed over a substrate 10. Then, an amorphous silicon film is formed, which is irradiated with laser to be a crystalline silicon film 12.

For the substrate 10, an insulating substrate such as a glass substrate, a quartz substrate and a crystalline glass, a ceramic substrate, a stainless substrate, a metal substrate (e.g., tantalum, tungsten, and molybdenum), a semiconductor substrate, a plastic substrate (e.g., polyimide, acrylic, polyethylene terephthalate, polycarbonate, polyarylate, and polyether sulfone), or the like can be employed as long as it can withstand at least the heat generated during the process. The substrate may be polished by CMP or the like as required in advance. A glass substrate is employed in this embodiment mode.

The base insulating film 11 is provided in order to prevent an alkali metal or an alkaline earth metal in the substrate 10 from diffusing in the crystalline silicon film. This is because these elements adversely affect the semiconductor property of the crystalline silicon film. The base insulating film 11 can be formed with a single-layer structure or a laminated structure by employing silicon oxide, silicon nitride, silicon oxynitride, silicon nitride oxide, or the like. Note that the base insulating film 11 is not necessarily provided in the case of using the substrate which is free of the dispersion of an alkali metal, an alkaline earth metal, or the like.

In this embodiment, the base insulating film 11 is formed with a laminated structure in which a silicon nitride oxide film is formed at a thickness of 50 nm as a first-layer insulating film and a silicon oxynitride film is formed at a thickness of 100 nm as a second-layer insulating film. Note that the difference between a silicon nitride oxide film and a silicon oxynitride film is the difference in composition ratio of nitride to oxide. The former indicates that the content of nitrogen is larger than the latter. Both of them can be formed by plasma CVD.

Subsequently, the amorphous silicon film is formed at a thickness of 25 to 100 nm (preferably, at a thickness of 30 to 60 nm) over the base insulating film. As the forming method, a known method such as sputtering, low pressure CVD, and plasma CVD can be adopted. In this embodiment, the amorphous silicon film is formed at a thickness of 50 nm by plasma CVD. Subsequently, dehydrogenation is performed by heat treatment for 1 hour at a temperature of 500° C.

Then, the amorphous silicon film is crystallized to form the crystalline silicon film 12 by using a laser irradiation apparatus. For the laser crystallization in this embodiment, laser beam oscillated by an excimer laser is formed into a rectangular beam spot by using an optical system to irradiate to the semiconductor film.

Alternatively, as the crystallization method, heat treatment can be adopted using an element for promoting the crystallization thereof. An element for promoting crystallization, which is typified by nickel, enables crystallization to be performed at low temperature in short time as compared with the crystallization without using such an element. Therefore, this method can be preferably adopted in the case where the substrate is relatively weak of heat such as a glass substrate. The element for promoting crystallization includes iron, palladium, tin, lead, cobalt, platinum, copper, and gold as well as nickel. One or more elements selected from them can be employed. In addition, after this, the substrate may be irradiated with laser and the like in order to improve the crystallinity.

Alternatively, it is possible that a microcrystalline semiconductor film is formed by plasma CVD or the like and then crystallized by a laser so as to be employed as the crystalline semiconductor film.

Subsequently, so-called channel doping is performed by doping a slight amount of impurities for controlling the threshold to the crystalline silicon film 12 as required. In order to obtain the appropriate threshold, boron, phosphorous, or the like is added by ion doping or the like.

Figure 6A:
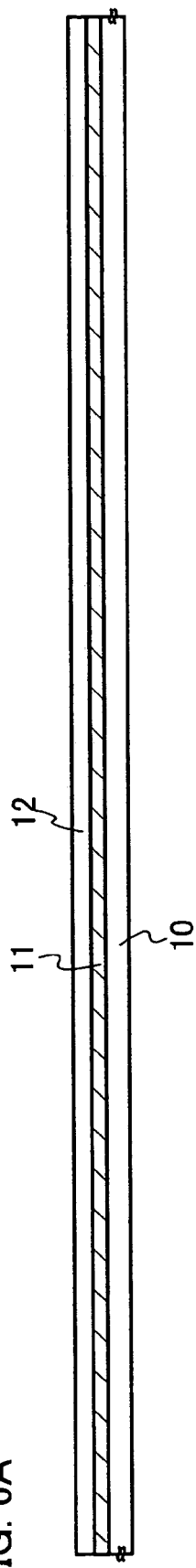
FIGS. 6A to 6C are diagrams illustrating a manufacturing process of a semiconductor device according to the invention.
Figure 6B:
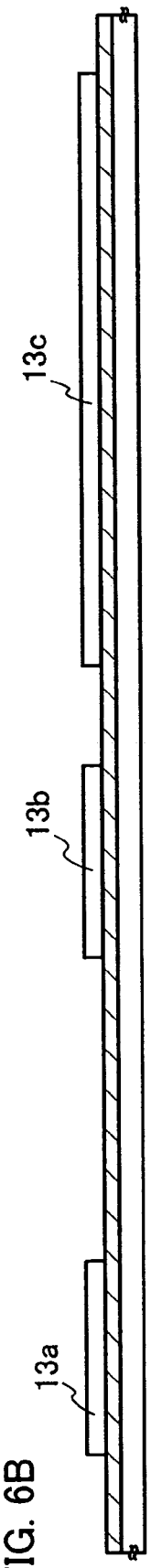

Then, 12 is patterned into predetermined shapes to obtain island-shape crystalline silicon films 13a to 13c as shown in FIG. 6B. The patterning is performed by coating a photo resist over the crystalline silicon film 12; exposing to be the predetermined mask shape and baking it to form a mask over the crystalline semiconductor film; and etching the crystalline silicon film 12 using the mask by dry etching. $CF_4$, $O_2$, or the like is used as a gas in the dry etching. The semiconductor layers 13a and 13b are semiconductor layers to be active layers of the thin film transistor of the invention which correspond to active layers 101a and 101b in FIG. 1B. A portion denoted by A-B in FIGS. 6A to 9C corresponds to a cross sectional diagram of FIGS. 1A and 1B along a line of A-B. The thin film transistor formed in the portion A-B may have a structure described in Embodiment Mode 2.

Subsequently, a gate insulating film 14 is formed so as to cover the crystalline semiconductor films 13a to 13c. The gate insulating film is formed by using an insulating film containing silicon by plasma CVD or sputtering at a thickness of 40 to 150 nm. In this embodiment, the gate insulating film 14 is formed by using a silicon oxide film by plasma CVD at a thickness of 100 nm.

Figure 6C:
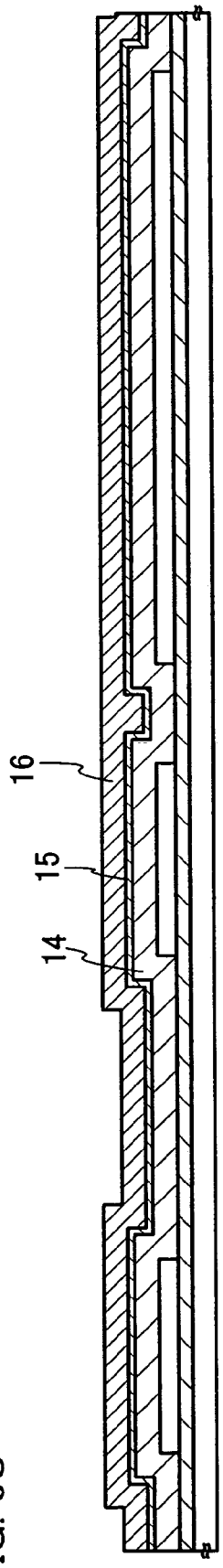

Subsequently, tantalum nitride (TaN) 15 is stacked at a thickness of 30 to 60 nm as a first conductive layer, and tungsten (W) 16 is stacked at a thickness of 200 to 400 nm as a second conductive layer over the gate insulating film in this order. In this embodiment, a TaN film at a thickness of 30 nm and a W film at a thickness of 370 nm are formed. Both of the TaN film and the W film are formed by sputtering in such a way that the TaN film is formed by using Ta as a target in a nitrogen atmosphere whereas the W film is formed by using W as a target (FIG. 6C).

Subsequently, resist masks 17a to 17e are formed through exposure step by photolithography in order to form electrodes and wirings by etching the conductive layers. Then, as shown in FIG. 7A, first conductive films 18a to 18e and second conductive films 19a to 19e are etched to be taper shape while the resist masks 17a to 17e being recessed.

Then, as shown in FIG. 7B, an n-type impurity such as phosphorus is ion-doped at a high concentration to the semiconductor layers 13a to 13c by using the resist patterns 17a to 17e and second conductive layers 19a to 19e as masks in order to form source and drain regions 20 to 25 and a capacitance electrode 26. The doping condition of phosphorus differs depending on the thickness of the gate insulating film 14 and the activation condition of the impurity. In this embodiment, the gate insulating film 14 is formed by using a silicon oxide film at a thickness of 100 nm so that acceleration voltage is 40 kV and the dosage is $1 \times 10^{15}$ to $8 \times 10^{15}$ atoms/cm$^2$.

Subsequently, as shown in FIG. 7C, only the second conductive layers 19a to 19e are selectively etched by using the resist patterns 17a to 17e as masks. The second conductive layers 19a to 19e are processed to expose the first conductive films 18a to 18e so as to be about 1 μm in length in the channel direction.

Then, as shown in FIG. 7D, the first conductive films 18a to 18e are etched by using the resist patterns 17a to 17e and the second conductive layers 19a to 19e as masks to remove the exposed portions of the first conductive films 18a to 18e so that first-layer gate electrodes 27a to 27e are formed by the first conductive films 18a to 18e and the second conductive films 19a to 19e.

Subsequently, as shown in FIG. 8A, the resist patterns 17a to 17e are removed. An n-type impurity such as phosphorus is ion-doped at a low concentration to the semiconductor layers 13a to 13c by using the first-layer gate electrodes 27a and 27c to 27e as masks in order to form LDD regions (low concentration impurity regions) 28 to 35. Accordingly, respective channel regions 36 to 39 of the n-type thin film transistors are equal in size to the respective gate electrodes, and the LDD regions 28 to 35 are formed in a self-aligned manner correspondingly to the gate electrodes. The phosphorus is doped to a region for forming a capacitor as well. Note that the LDD region is formed at least on the drain region side.

Subsequently, heat treatment is applied at a temperature of 550° C. Since the gate electrode is exposed, the heat treatment is preferably performed in an atmosphere containing less oxygen in order to prevent the oxidation of the gate electrode. By this heat treatment, the impurity in the semiconductor layers is activated. Note that in the case of performing the crystallization using an element for promoting crystallization, the element for promoting crystallization is introduced to the high concentration impurity region (the source and drain regions), accordingly, gettering can be carried out as well.

Heat is applied in the activation treatment, therefore, substrate shrinkage may occur. If the substrate is shrunk at this stage, second-layer gate electrodes 43a to 43c to be formed subsequently are deviated from the designed positions. This bring a variation of gate parasitic capacitance so that a property of the thin film transistor and an operation of a circuit employing the thin film transistor may be affected and a variation thereof may occur. In a driver of a display device which is formed by repeating the same pattern, in particular, the variation tends to be easily detected. In addition, the deviation occurrs in the opposite directions between one end of the substrate and the other end due to heat shrinkage, which becomes an even more significant influence. However, by using the thin film transistor of the invention as described in this embodiment, the influence can be suppressed, which leads to the improvement of the display quality and the decrease of the defect. In addition, the second-layer gate electrodes 43a to 43c may be formed with positional deviation due to such a simple reason that alignment is deviated in etching a third conductive film 40 after the third conductive film 40 is formed. That influence can be alleviated as well by using the thin film transistor or the semiconductor device of the invention. In this case, when the direction of length is set along the direction in which large variations are caused by the substrate shrinkage (that is a direction in which the same patterns are aligned toward a direction of shrinking the substrate), a circuit having few variations of circuit load can be formed.

In addition, in the case of a large substrate, heat shrink is largely affected, and an exposure may be performed a plurality of times for each portion (a consecutive exposure) in exposing the photo resist. In the case where a consecutive exposure is performed, in particular, the mask alignment is difficult to be adjusted, thus the thin film transistor or the semiconductor device of the invention may be advantageously applied.

After the heat treatment, the third conductive film 40 is formed by using a low-resistance material over a whole surface including the gate electrodes as shown in FIG. 8B. In this embodiment, a step of activating impurity and the like is already terminated at this stage and no more high heat is applied in the subsequent steps, therefore the third conductive film 40 can be formed by using Al.

Subsequently, a photo resist film is coated over the third conductive film 40 as shown in FIG. 8C, and exposed and developed to form resist patterns 41a to 41d over the third conductive film 40. Then, the third conductive film 40 is etched by using the resist patterns 41a to 41d as masks so that the second-layer gate electrodes 43a to 43c are formed over the gate electrodes 27a to 27c of thin film transistors in a driver circuit portion 42, and a second capacitance electrode 44 is formed over the high concentration impurity diffusion layer 26, which is to be a capacitance electrode with the gate insulating film 14 interposed therebetween. Before the second-layer gate electrodes are formed, the substrate is shrunk due to the heat treatment for crystallization. Furthermore, the second-layer gate electrodes 43a to 43c and the second capacitance electrode 44 may be formed respectively at a position different from the actually designed position due to mask misalignment or the like. However, by applying the invention, a variation of parasitic capacitance of the thin film transistor due to such an influence thereof may be suppressed.

The third conductive film 40 may be formed by using Cu, Ag, or the like. Since such a metal is resistant to heat, the heat treatment such as the activation may be performed after the third conductive film 40 is formed. In this case, deviation of the second-layer gate electrodes 43a to 43c and the second capacitance electrode 44 due to heat shrink of the substrate does not occur while influence due to mask misalignment can be suppressed according to this invention.

In this manner, the n-type thin film transistor in the driver circuit portion 42 can be formed with a gate-overlapped LDD structure while an n-type thin film transistor 46 in a pixel portion 45 can be formed with an LDD structure. The thin film transistor having the gate-overlapped LDD structure exhibits a high current driving performance and is highly resistant to hot carrier deterioration with a power source voltage of 10 to 20 V. Meanwhile, the thin film transistor having the LDD structure, which is formed at the same time here, is confirmed to be effective for suppression of off-leakage current. That is, in a liquid crystal display device for displaying a pixel by storing a pixel signal in a capacitor, the thin film transistor with the LDD structure is preferably employed which is superior in suppression of off-leakage current as a switching element of the pixel whereas the thin film transistor with the gate-overlapped LDD structure is preferably employed which is superior in current driving performance and is highly resistant to hot carrier deterioration in the driver circuit portion at the periphery. The same applies to the case of a light-emitting display device.

The second-layer gate electrodes 43a to 43c are preferably formed by using a low-resistance metal material. A single layer of Al or an alloy of Al, or a laminated layer of Al as a main component is preferably employed as the low-resistance metal material.

In this embodiment, a forming method of a thin film transistor is described in which a gate electrode has a laminated structure, however, the thin film transistor of the invention can be applied to another structure than this. For example, the invention can be applied to a thin film transistor in which a gate electrode has a single-layer structure formed by such a manner that a photo resist mask is formed over a gate insulating film, doping for a high concentration impurity region and an LDD region is performed, the photo resist is removed, activation of the impurity is performed, and then the gate electrode is formed. In this structure, a disadvantage due to mask deviation in forming the gate electrode or due to substrate shrinkage by heat treatment, or the like may be alleviated as well.

A capacitor 47 is structured by the second capacitance electrode 44, the gate insulating film 14, and the capacitance electrode 26. Stable capacitance can be obtained by structuring the capacitor 47 similarly as the thin film transistor and forming the capacitance electrode 26 in the same layer as source and drain regions even in the case where the second capacitance electrode 44 has 0 V. Area of the capacitor 47 can be made smaller by forming the gate insulating film 14 thin. Therefore, in the step of etching the first conductive films 18a to 18e and the second conductive films 19a to 19e shown in FIGS. 7A to 7D, the thickness of the gate insulating film 14 in a region for forming the capacitor 47 is preferably made thin in order to thin the thickness thereof. Accordingly, the area of the capacitor 47 can be reduced without adding an etching step.

Figure 9A:
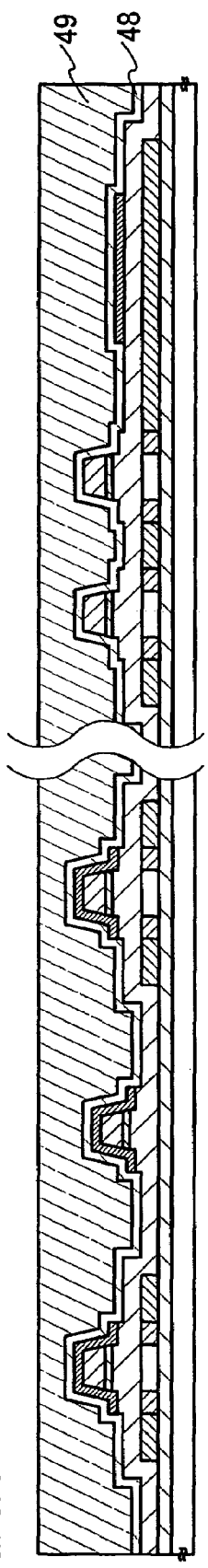
FIGS. 9A to 9C are diagrams illustrating a manufacturing process of a semiconductor device according to the invention.

Subsequently, as shown in FIG. 9A, an insulating film containing hydrogen such as a silicon nitride film 48 is formed over a whole surface including the second-layer gate electrodes 43a to 43c and the second capacitance electrode 44, and heat treatment for hydrogenation is performed at a temperature of 350° C. or more. By this heat treatment, a crystal defect of the semiconductor layer (crystalline silicon film) can be terminated with hydrogen. Note that the silicon nitride film 48 containing hydrogen is formed and then the heat treatment for hydrogenation is performed in this embodiment, however, the same result can be obtained when a silicon oxide film is formed and then heat treatment is performed in an atmosphere containing 3 to 100% hydrogen at a temperature of 350° C. or more. In this case, a load of a circuit operation can be made smaller as compared with the case where the silicon nitride film is employed and capacitance between electrodes can be reduced, because the relative permittivity of the silicon nitride film is about twice that of the silicon oxide film.

Subsequently, an interlayer insulating film 49 is formed over the silicon nitride film 48 by using a self-flattering organic or inorganic insulating film. As the inorganic insulating film, for example, a silicon oxide film formed by CVD, a silicon oxide film formed by coating by SOG (Spin On Glass), a film made of a material such as siloxane which has a bond of silicon and oxygen as a backbone structure and contains hydrogen as a substituent or further contains at least one of fluorine, an alkyl group, and aromatic hydrocarbon as a substituent, or the like can be used. On the other hand, for the organic insulating film, polyimide, polyamide, BCB (benzocyclobutene), acrylic, a positive type photosensitive organic resin, a negative type photosensitive organic resin, or the like can be employed. In addition, a low-k material can be preferably employed. Further, a laminated structure thereof may be employed. In this embodiment, the interlayer insulating film 49 is formed by using photosensitive polyimide.

Figure 9B:
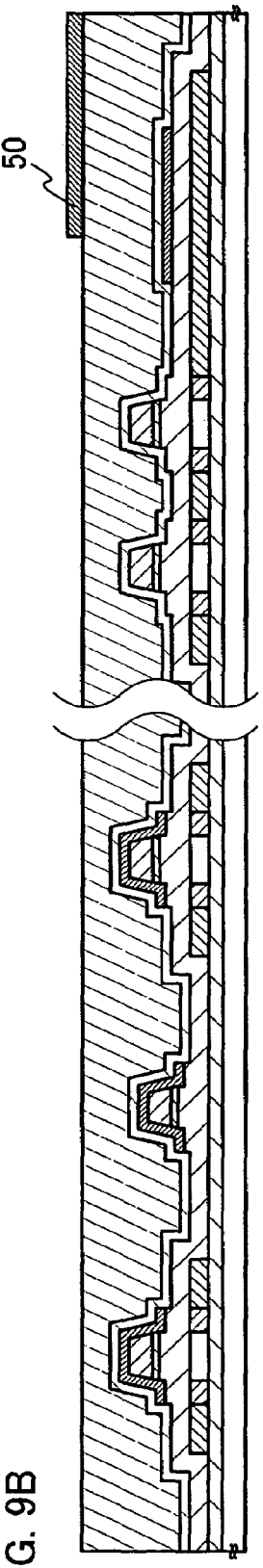

Then, as shown in FIG. 9B, a pixel electrode 50 is formed by using a transparent conductive film such as an ITO over the interlayer insulating film 49.

Figure 9C:
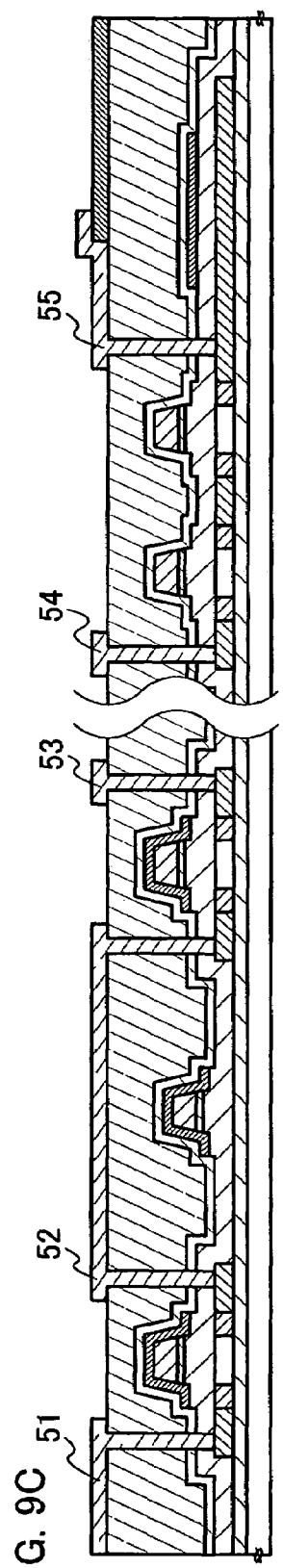

Subsequently, as shown in FIG. 9C, contact holes (connection openings) to reach the source region and the drain region are formed by etching in the interlayer insulating film 49, the silicon nitride film 48, and the gate insulating film 14. Then, a conductive film is formed by using a low-resistance material within the contact holes and over the interlayer insulating film 49, and etched. Accordingly, source and drain electrodes 51 to 55 each formed by the conductive film are formed in the n-type thin film transistors in the driver circuit portion 42 and the n-type thin film transistor 46 in the pixel portion respectively. The drain electrode 55 is connected to the pixel electrode 50. Note that the source and drain electrodes 51 to 55 may be structured by a single layer made of Al, Cu, or the like, however, they may have a laminated structure. In particular, a laminated structure in which TiN, Al, TiN, and Ti are stacked in this order from the top layer may be preferably employed in the case of preventing diffusion of the electrode material into the semiconductor layer as well the hillock generation due to stress migration.

In the semiconductor device according to this embodiment, not a p-type thin film transistor but an n-type thin film transistor is formed in the driver circuit portion 42 and in the pixel portion 45, however, a p-type thin film transistor may be formed instead. In this case, only the step of injecting an impurity element is different between the respective steps.

The capacitor 47 functions to store a pixel signal which is transmitted to a pixel through a pixel switching element, which is structured by the capacitance electrode having the high concentration impurity region in the same layer as the source and drain regions of the n-type thin film transistor 46, the gate insulating film 14 of the thin film transistor 46, and the second capacitance electrode 44.

According to this embodiment, a thin film transistor with a gate-overlapped LDD structure and a thin film transistor with an LDD structure can be formed over the same substrate without adding a step. In addition, a material containing as a main component Al which is low in resistance and inexpensive while low in heat resistance can be employed to the second-layer gate electrode, because the thin film transistors are formed in such a manner that the thin film transistor with an LDD structure is formed, heat treatment for activating impurity is performed, and then the second-layer gate electrode is formed to form the gate-overlapped LDD structure and reduce the resistance of the gate electrode wiring. Accordingly, a large-sized image display device may be provided at low price which is capable of operating at high speed and superior in the image display property. Note that the gate electrode may have one layer in some cases where the LDD structure or the gate-overlapped LDD structure is formed by using a mask such as a photo resist.

Embodiment 3

This embodiment describes an example of a thin film transistor to which the invention is applied with reference to FIGS. 10A to 10C, which differs from Embodiment Mode 2. The steps up to FIG. 10A are the same as those shown in FIGS. 6A to 8A, therefore, description thereof is omitted. FIG. 10A illustrates the same state as FIG. 8A.

Following the state shown in FIG. 10A, an insulating film 700 is formed over a whole substrate. The insulating film 700 is formed by a single layer or multiple layers by using a silicon nitride film and a silicon nitride film containing oxygen. As the forming method, a known method such as plasma CVD can be employed.

Subsequently, heat treatment is performed at a temperature of 550° C. Here, the gate electrode and wiring is prevented from being oxidized since it is covered with the insulating film 700. By this heat treatment, the impurity in the semiconductor layer is activated as well as Ni in the channel region is introduced to the high concentration impurity region (the source and drain regions) to perform gettering. Note that the heat treatment can be performed by any of furnace annealing, lamp annealing, and laser annealing. Subsequently, a third conductive film 701 is formed by using a low resistance material over the insulating film 700. Note that the third conductive film 701 may be formed by a laminate layer in which a barrier film formed by titanium nitride and the like and a layer formed by Al or an Al alloy are laminated, or by a layer formed by Al or an Al alloy.

Then, a photo resist film is coated over the third conductive film 701 to be exposed and developed. As a result, resist patterns 702 to 705 are formed over the third conductive film 701. Subsequently, the third conductive film 701 is etched by using the resist patterns 702 to 705 as masks, so that second-layer gate electrodes 706 to 708 are formed over the gate electrodes of the thin film transistors in the driver circuit portion 710 respectively with the insulating film 700 interposed therebetween while a second-layer capacitance electrode 709 is formed over a capacitance electrode 714 with the insulating film 700 interposed therebetween. A capacitor 712 is structured by the second-layer capacitance electrode 709, the insulating film 700, and the capacitance electrode 714. Note that a reference numeral 711 denotes a pixel thin film transistor and a reference numeral 713 denotes a pixel portion.

Figure 11:
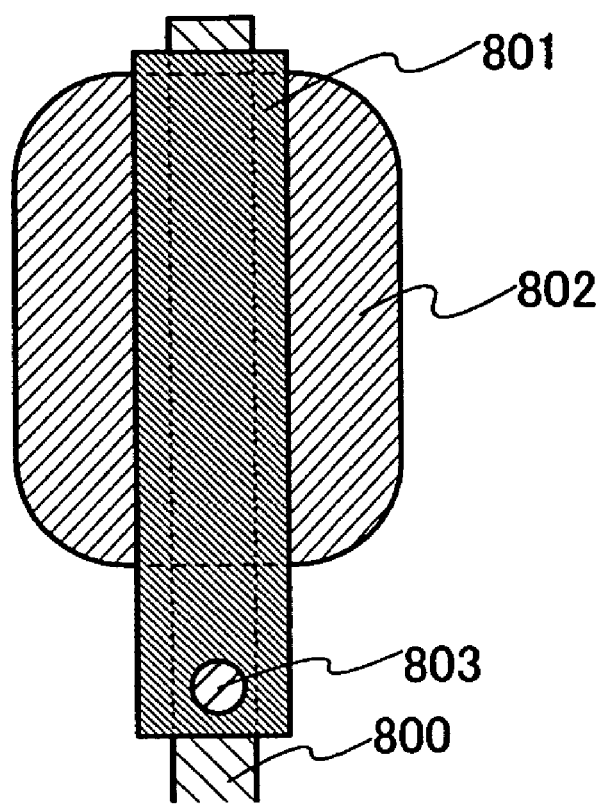
FIG. 11 is a top plan diagram of a semiconductor device according to the invention.

After that, the same steps as those shown back from FIG. 9A are performed to manufacture a display device. According to this embodiment, the insulating film 700 is interposed between the second-layer gate electrodes 706 to 708 and the first-layer gate electrodes, and a first-layer gate electrode 800 and a second-layer gate electrode 801 are connected as shown in FIG. 11. Note that a reference numeral 802 denotes a semiconductor layer and a reference numeral 803 denotes a contact hole. In addition, an auxiliary capacitor may be formed by using the second-layer gate electrodes 706 to 708, the insulating film 700, and the first-layer gate electrodes.

Embodiment 4

Figure 12:
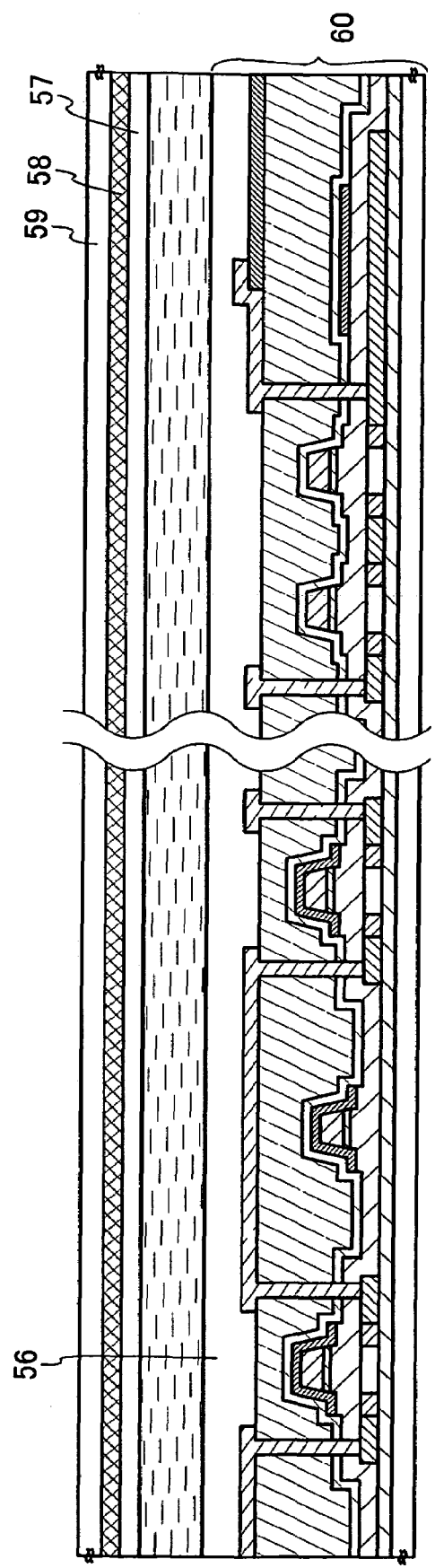
FIG. 12 is a cross sectional diagram of a liquid crystal display device manufactured using a semiconductor device according to the invention.

This embodiment describes a method for manufacturing a liquid crystal display device by using a substrate formed by a method described in Embodiment 2 with reference to FIG. 12. An insulating layer 56 called an alignment film is formed so as to cover the pixel electrode 50. Note that the insulating layer 56 can be selectively formed by screen printing or off-set printing. Then, rubbing is performed, and a sealant is formed around the pixel region.

Subsequently, an opposing substrate 59 provided with an insulating layer 57 functioning as an alignment film and a conductive layer 58 functioning as an opposite electrode is attached to an element substrate 60 with a spacer, and a liquid crystal layer is provided therebetween, so that a liquid crystal display panel can be manufactured. The sealant may be mixed with a filler, and the opposing substrate 59 may be provided with a color filter, a shielding film (a black matrix) or the like. Note that the liquid crystal layer can be formed by a dispenser type (a dropping type) method or a dipping type (a pumping type) method in which a liquid crystal is injected by using a capillary phenomenon after attaching the opposing substrate 59.

In a liquid crystal droplet injection method employing the dispenser method, a closed loop is formed with the sealant, and therein a liquid crystal is dropped once or plural times. Then, the substrates are attached in vacuum, and cured by ultraviolet to obtain the space filled with liquid crystals.

Subsequently, a wiring board for connection is provided with an anisotropic conductive layer interposed therebetween. The wiring board functions to transmit an external signal and potential. Through the above-described steps, the liquid crystal display panel is completed.

By the above-described steps, a liquid crystal display device provided with the thin film transistor and the semiconductor device of the invention can be manufactured.

Embodiment 5

Figure 13:
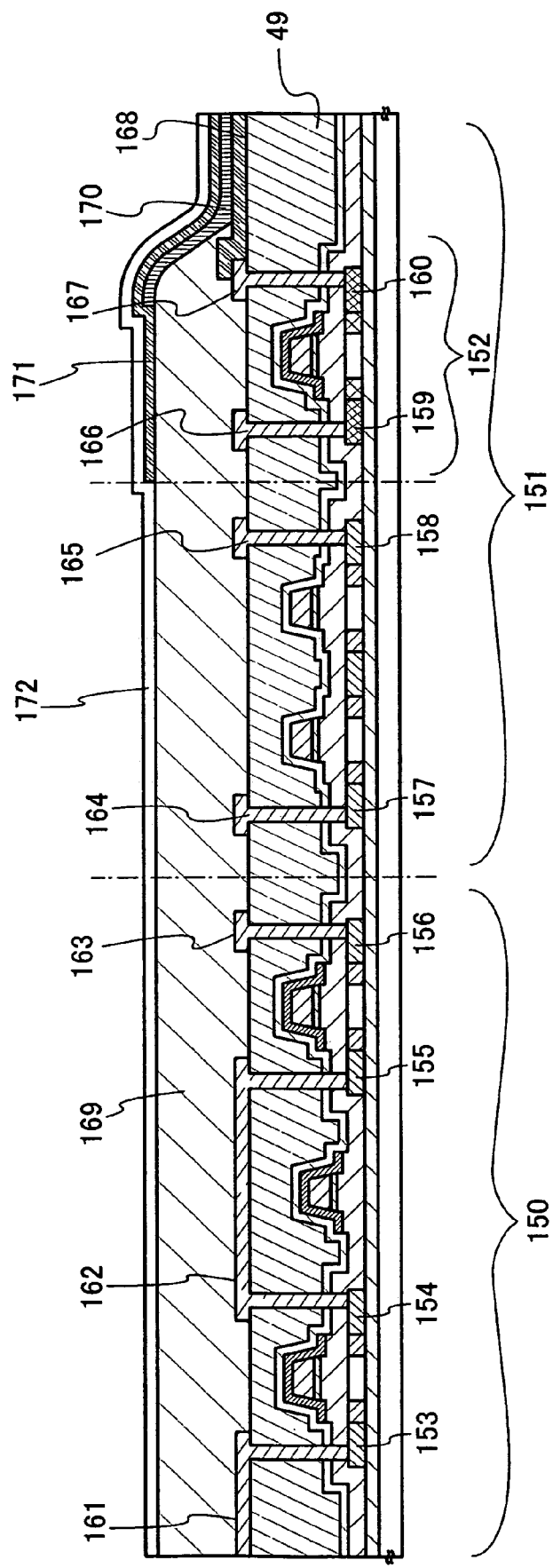
FIG. 13 is a cross sectional diagram of a light-emitting display device manufactured using a semiconductor device according to the invention.

This embodiment describes an example of manufacturing a light-emitting display device by using the thin film transistor of the invention with reference to FIG. 13. Similarly to the description in Embodiment 2, the thin film transistors are formed in the driver circuit portion 150 and the pixel portion 151 over the substrate 10. The layout of the thin film transistor and the impurity element to be injected into the semiconductor layer are arbitrarily determined depending on its expected performance. In this embodiment, the description is given from a step of forming the interlayer insulating film 49, on the assumption that the second conductive layer used as a portion of the gate electrode is made of molybdenum and a driving transistor 152 of a light-emitting element is a p-type transistor.

In this embodiment, the interlayer insulating film 49 is formed by using siloxane. Siloxane polymer coated over a whole surface is dried by heat treatment for 10 minutes at a temperature of 50 to 200° C., and then baking treatment is employed for 1 to 12 hours at a temperature of 300 to 450° C. so that the interlayer insulating film 49 is formed. By this baking, a siloxane film is formed at a thickness of 1 μm over a whole surface. In this step, hydrogenation and impurity activation of the semiconductor layer are performed with hydrogen in the silicon nitride film 48 simultaneously with the baking of the siloxane polymer.

Subsequently, a silicon nitride oxide film or a silicon oxynitride film may be formed by CVD so as to cover the interlayer insulating film 49. This film functions as an etching stopper to prevent overetching of the interlayer insulating film when a conductive film that is formed later is etched. Note that the silicon oxynitride film is preferably formed at sufficient thickness to be removed simultaneously with the etching of the wiring, which beneficially affects on the reliability of a light-emitting element that is formed later.

Then, the interlayer insulating film 49 is patterned and etched to form contact holes which reach the high concentration impurity regions 153 to 160 respectively.

Then, a metal film is laminated within the contact holes and patterned to form a source electrode and a drain electrode. In this embodiment, source or drain electrodes, or wirings 161 to 167 are formed respectively with a three-layer structure in which molybdenum, aluminum, and molybdenum are stacked in this order over the substrate.

Subsequently, a step of manufacturing a light-emitting device by using the above-described semiconductor element follows.

In a light-emitting device described in this embodiment, a layer containing a light-emitting material is sandwiched between a pair of electrodes, and an element which emits light by current flowing between the electrodes is arranged in matrix.

As the excitation state of a light-emitting element, there are known a singlet excitation and a triplet excitation, and it is considered that the light emission can be obtained through either of the excitation states. Therefore, the element in the singlet excitation state and the element in the triplet excitation state may be used in combination in one light-emitting device depending on the property of the each element. For example, in three colors of RGB, an element of triplet excitation state may be used for red emission, whereas an element of singlet excitation state may be used for blue and green emission. Note that the element of triplet excitation state generally has high luminous efficiency, thereby contributing to the decrease of the driving voltage.

As the material for a light-emitting element, a low-molecular weight light-emitting material, a high-molecular weight light-emitting material, or a medium-molecular weight light-emitting material having an intermediate property between the low molecule and the high molecule can be employed. In this embodiment, a low-molecular weight light-emitting material is employed. The low-molecular weight material or the high-molecular weight material dissolved in a solvent can be coated by spin coating or ink jetting. Note that not only an organic material but also a composite material of the organic material and an inorganic material can be employed.

A first electrode 168 of the light-emitting element is formed so as to partially overlap the drain electrode 167 of the thin film transistor formed through the preceding steps. The first electrode 168 serves as an anode or a cathode of the light-emitting element. In the case of using it as the anode, a metal with a high work function, an alloy, an electrically conductive compound, the mixture of them, or the like is preferably employed. A work function of about 4.0 eV or more is an approximate indication of the work function. As a specific material, ITO (indium tin oxide), IZO (indium zinc oxide) in which 2 to 20% zinc oxide (ZnO) is mixed in indium oxide, GZO in which gallium is doped to zinc oxide, ITSO in which 2 to 20% silicon oxide ($SiO_2$) is mixed into indium oxide, gold (Au), platinum (Pt), nickel (Ni), tungsten (W), chrome (Cr), molybdenum (Mo), iron (Fe), cobalt (Co), copper (Cu), paradium (Pd), and nitride of a metal material such as titanium nitride (TiN), and the like can be employed.

On the other hand, in the case of using it as the cathode, a metal with a low work function (an appropriate indication is a work function of 3.8 eV or less), an alloy, an electrically conductive compound, a mixture of them, or the like is preferably employed. Specifically, an element belonging to group 1 or 2 in the periodic table, that is, an alkaline metal such as Li and Cs, an alkaline earth metal such as Mg, Ca, and Sr, an alloy (Mg—Ag or Al—Li) or a compound (LiF, CsF, or $CaF_2$) containing them, or a transition metal containing a rare-earth metal can be employed. However, in this embodiment, a second electrode is formed to transmit light, therefore, the metal or the alloy containing the metal is formed quite thin, and the second electrode is formed by stacking ITO, IZO, ITSO, GZO, or another metal (including an alloy).

In this embodiment, the first electrode 168 serves as an anode, and ITSO is employed. When ITSO is used as an electrode, the reliability of a light-emitting device can be improved by performing vacuum baking.

Note that in this embodiment, the first electrode 168 is formed after the source or drain electrodes 161 to 167 of the thin film transistors are formed, however, the first electrode 168 may be formed first, and then the electrodes of the thin film transistors may be formed.

Subsequently, an insulating film 169 is formed so as to cover the edge of the first electrode 168. The insulating film 169 is called a bank or a partition wall. An inorganic insulating film or an organic insulating film can be used as the insulating film 169. As the inorganic insulating film, a silicon oxide film formed by CVD, a silicon oxide film coated by SOG (Spin On Glass), or the like can be used. As the organic insulating film, a film formed by using photosensitive or nonphotosensitive polyimide, polyamide, BCB (benzocyclobutene), or acryl, or a positive type photosensitive organic resin, a negative type photosensitive organic resin, or a material, so-called siloxane, which has a bond of silicon and oxygen as a skeleton structure and contains hydrogen as a substituent or further contains at least one of fluorine, an alkyl group, and aromatic hydrocarbon as a substituent can be used. Alternatively, a laminated structure of them may be employed. When the insulating film 169 is formed using a photosensitive organic material, the opening has a shape of which curvature radius varies continuously. Thus, it is preferable in that disconnection of the film hardly occur in depositing an electroluminescent layer. In this embodiment, photosensitive polyimide is employed.

Subsequently, deposition of an electroluminescent layer 170 is performed by using a deposition apparatus while moving its evaporation source. The deposition is performed in a film formation chamber which is evacuated to the degree of $5 \times 10^{-3}$ Torr (0.665 Pa) or less, and preferably, the degree of $10^{-4}$ to $10^{-6}$ Torr. In the deposition, the organic compound which is vaporized by resistance heating in advance is scattered to the direction of the substrate by opening a shutter. The vaporized organic compound is scattered upward, and deposited over the substrate through an opening provided in the metal mask, so that the electroluminescent layer 170 (from the side of the first electrode: a hole injection layer, a hole transporting layer, a light-emitting layer, an electron transporting layer, and an electron injection layer) is formed. Note that the structure of the electroluminescent layer 170 is not limited to this laminated structure, and the number of laminated layers may be small and a compound layer having the function of two layers may be employed as well. Furthermore, the electroluminescent layer 170 may be formed by a single layer or a mixed layer.

In this embodiment, a hole injection layer is formed by CuPc at a thickness of 20 nm, a hole transporting layer is formed by □-NPB at a thickness of 40 nm, a light-emitting layer is formed by Alq at a thickness of 50 nm, and an electron injection layer is formed by Al—Li at a thickness of 10 nm.

After the electroluminescent layer 170 is formed, a second electrode 171 is formed so as to be in contact with the electroluminescent layer 170. In this embodiment, the second electrode 171 is formed to be a cathode since the first electrode 168 serves as the anode. The material as described previously can be employed for the cathode. In this embodiment, an aluminum film is formed at a thickness of 150 nm to form the second electrode (cathode) 171.

Figure 14:
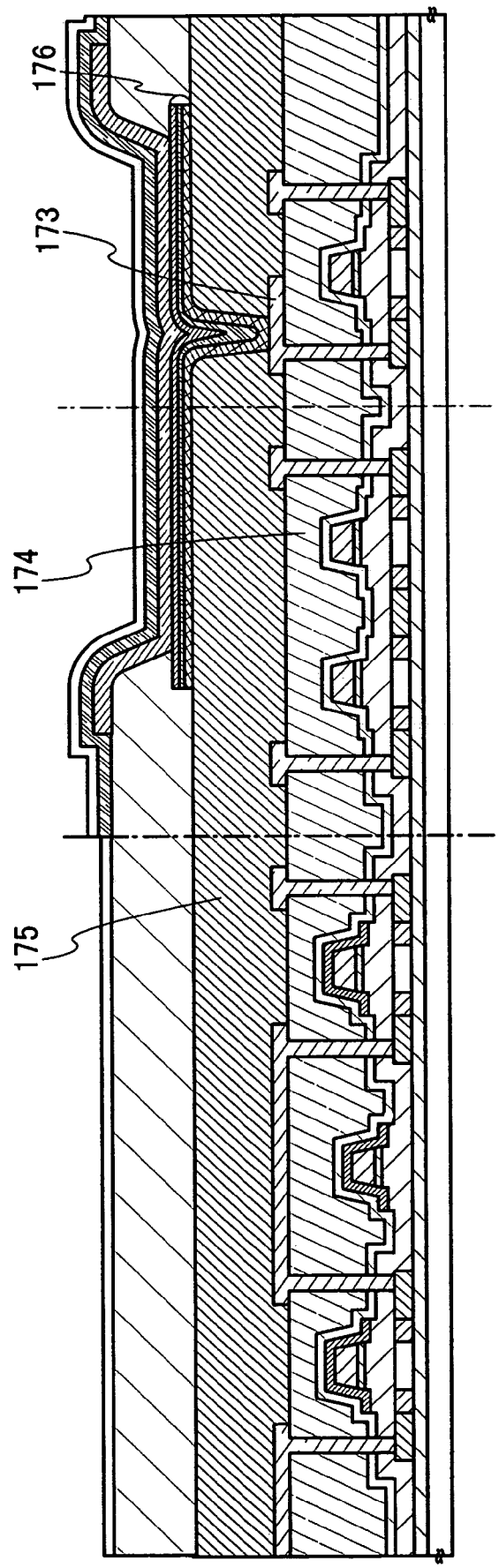
FIG. 14 is a cross sectional diagram of a light-emitting display device manufactured using a semiconductor device according to the invention.

In this embodiment, only the first electrode 168 is formed by using a light-transmitting material. Thus, light is taken from a bottom surface of the substrate. FIG. 14 is an example of a top-emission structure, in which a pixel electrode 176 and source or drain electrodes 161 to 165, 167, and 173 of the thin film transistors are formed in different layers. A first insulating film 174 and a second interlayer insulating film 175 can be formed by using the same material as the insulating film 169 in FIG. 13, and the combination of material can be freely determined. In this embodiment, both of the layers are formed by using siloxane. The pixel electrode 176 is formed by stacking Al—Si, TiN, ITSO in this order over the second interlayer insulating film 175, however, it may be a single layer or may have a laminated structure including two layers, or four or more layers.

Figure 15A:
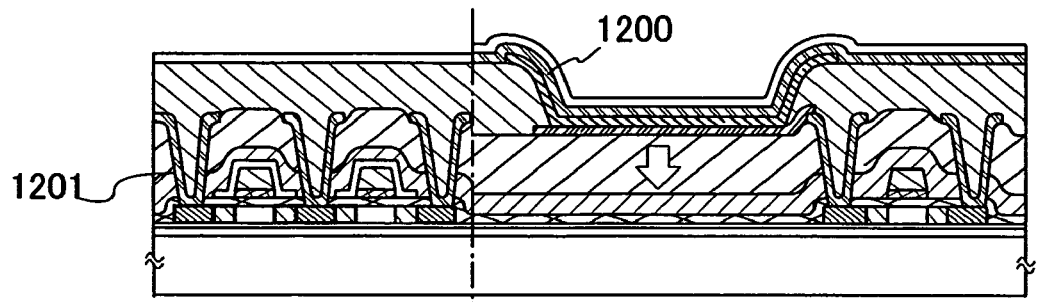
FIGS. 15A to 15C are diagrams each showing a structure and a light-emitting direction of a light-emitting device.
Figure 15B:
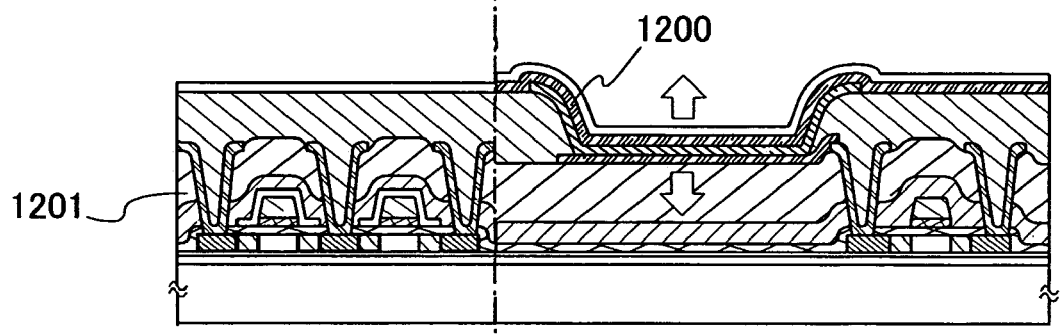
Figure 15C:
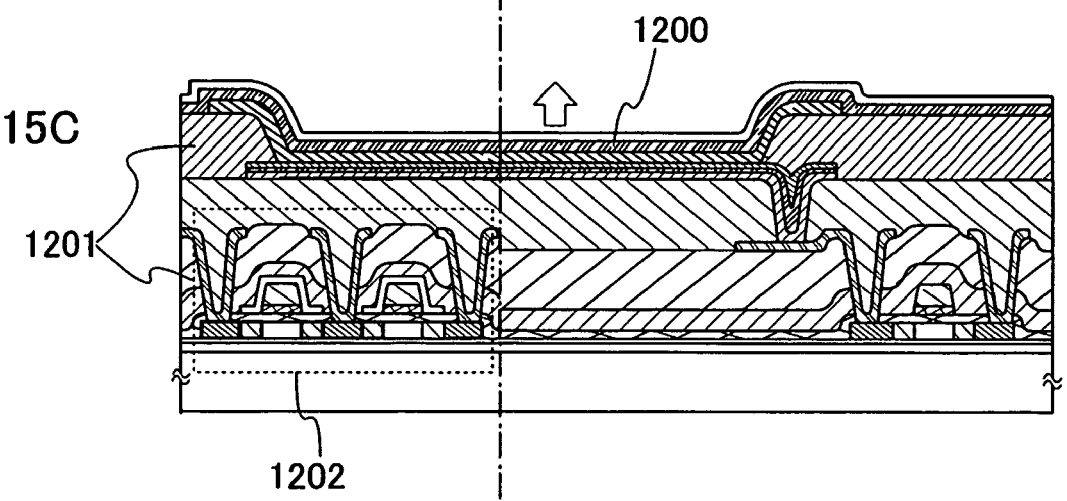

FIGS. 15A to 15C illustrate cases of a bottom-emission, a dual-emission, and a top-emission respectively. The bottom-emission structure described in this embodiment corresponds to the structure shown in FIG. 15A. A dual-emission light-emitting device capable of taking light from both surfaces as shown in FIG. 15B can be manufactured by stacking a material containing Li thin (at sufficient thickness to transmit light) under the second electrode 1200, and by forming the second electrode by using a light-transmitting material such as ITO, ITSO, and IZO. Note that aluminum or silver does not transmit light when being stacked to be a thick film whereas they transmits light when being stacked to be a thin film. Therefore, by forming the second electrode 1200 by using a film made of aluminum or silver at sufficient thickness to transmit light, the dual-emission structure can be realized.

FIG. 15C illustrates a top-emission light-emitting device, which corresponds to FIG. 14. When the number of interlayer insulating films 1201 is increased by one than those in the structures of FIGS. 15A and 15B, a light-emitting element can be provided above the thin film transistor 1202 as well, which is an advantage of the top-emission structure in the point of an aperture ratio.

The transparent electrode such as ITO and ITSO, which is used in the dual-emission structure or the top-emission structure, is difficult to be deposited by resistance heating, therefore, it is formed by sputtering or electron beam deposition. When the second electrode 171 is formed by sputtering or electron beam deposition, the surface of the electron injection layer or an interface between the electron injection layer and the electron transporting layer may be damaged, so that the property of the light-emitting element may be adversely affected. In order to prevent this, it is preferable to provide a material that is less subject to such damage at the position closest to the second electrode 171. The material that is less subject to such damage and that can be employed for the electroluminescent layer 170 is, for example, molybdenum oxide (MoOx). However, since MoOx is the preferable material for the hole injection layer, it is necessary that the second electrode 171 is the anode in order to provide MoOx in contact with the second electrode 171.

Figure 16A:
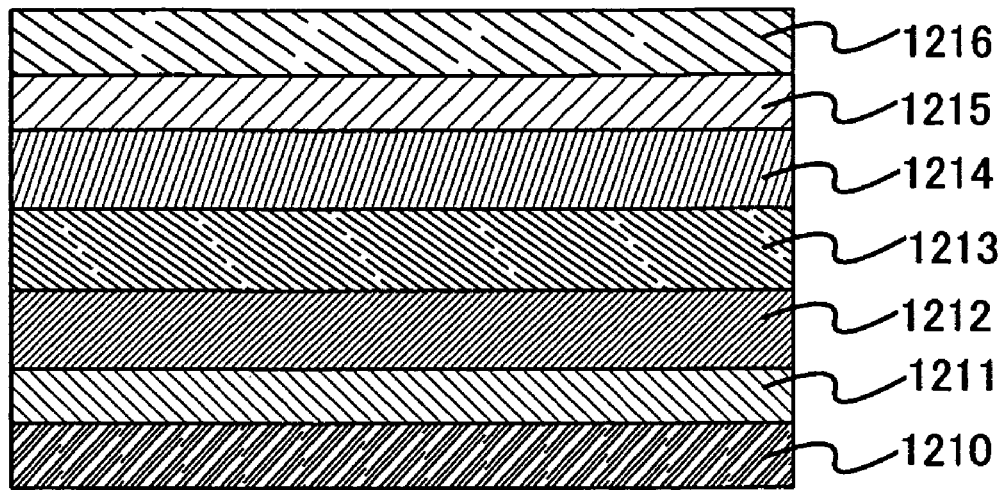
FIGS. 16A and 16B are diagrams each illustrating an element structure of a light-emitting element.
Figure 16B:
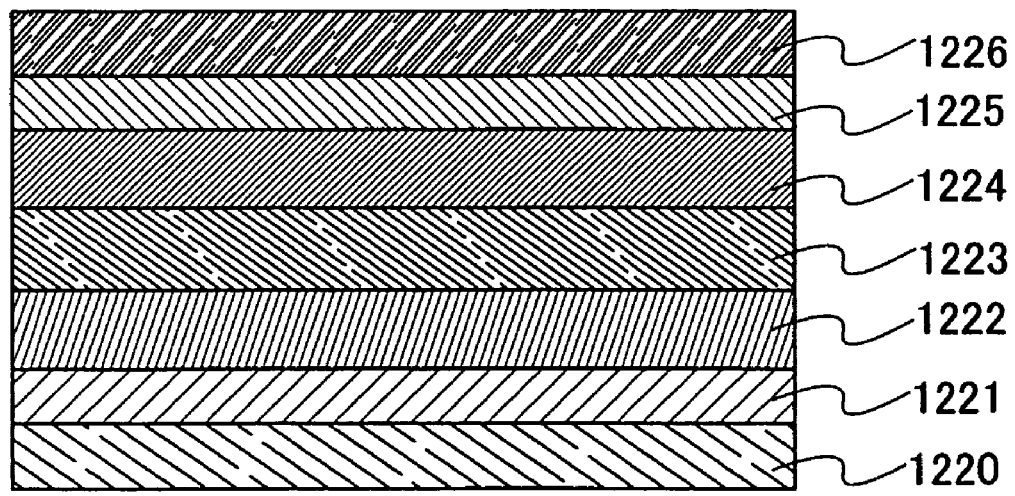

In this case, therefore, instead of structuring in the order shown in FIG. 16A (an anode 1210, a hole injection layer 1211, a hole transporting layer 1212, a light-emitting layer 1213, an electron transporting layer 1214, an electron injection layer 1215, and a cathode 1216) as is in this embodiment, the first electrode 168 is formed as a cathode 1220 first, and then an electron injection layer 1221, an electron transporting layer 1222, a light-emitting layer 1223, a hole transporting layer 1224, a hole injection layer (MoOx) 1225, and a second electrode (anode) 1226 are formed in this order as shown in FIG. 16B. In addition, a driving thin film transistor of a pixel is required to be n-type. In this embodiment, the driving transistor of the light-emitting element 152 is a p-type transistor. However, by using the above-described element, all the transistors over the substrate can be n-type transistors as well.

The MoOx is formed by deposition, and MoOx satisfying x=3 or more is preferably employed. Moreover, the MoOx layer may be formed to be an organic-inorganic composite layer by co-evaporating with an organic metal complex such as copper phthalocyanine (CuPc) or an organic material. In the case of using the light-emitting element as described above in which the first electrode 168 serves as a cathode, it is preferable that a transistor using a-Si:H, which is originally n-type, as the semiconductor layer be employed as a thin film transistor in the pixel portion because the process can be simplified. In the case where the driver circuit portion is formed over the same substrate as the pixel portion, only the driver circuit portion is preferably crystallized by laser irradiation.

Subsequently, a passivation film 172 is formed by using a silicon oxide film containing nitrogen by plasma CVD. As for the silicon oxide film containing nitrogen, a silicon oxynitride film formed by using $SiH_4$, $N_2O$, and $NH_3$, a silicon oxynitride film formed by using $SiH_4$ and $N_2O$, or a silicon oxynitride film formed by using a gas in which $SiH_4$ and $N_2O$ are diluted with Ar may be formed by plasma CVD. Alternatively, a silicon oxynitride hydride film formed by using $SiH_4$, $N_2O$, and $H_2$ may be used as the passivation film 172. Needless to say, the passivation film 172 is not limited to have a single-layer structure and it may be formed by a single layer or multiple layers by using another insulating film containing silicon. Moreover, a multilayer of a carbon nitride film and a silicon nitride film, a multilayer of styrene polymer, a silicon nitride film, or a diamond-like carbon film may be used instead of the silicon oxide film containing nitrogen or in addition to the silicon oxide film containing nitrogen in the form of a laminated structure.

Then, in order to protect the electroluminescent element from the deterioration-promoting material such as water, the display portion is sealed. When an opposing substrate is used to seal the display portion, the element substrate and the opposing substrate are attached with an insulating sealant so as to expose an external connection portion. The space between the opposing substrate and the element substrate may be filled with an inert gas such as dry nitrogen, or the sealant may be coated over the whole pixel portion to form the opposing substrate. For the sealant, an ultraviolet curable resin or the like is preferably employed. A drying agent or a particle for keeping the same gap may be mixed into the sealant. Subsequently, the flexible wiring board is attached to the external connection portion, so that an electroluminescent panel is completed.

Such an electroluminescent panel displays the image with a single color, an area color, a full color, or the like. The full-color display method is further divided into an RGB emitter's selective deposition method, a method in which RGB are made of a white-color light source by using a color filter, a method in which a color having a short wavelength is converted into a color having a long wavelength by using a color conversion filter, and the like. Moreover, a color filter may be used in order to improve the color purity.

Note that either of an analog video signal and a digital video signal can be used in the light-emitting display device having a display function of the invention. As for the digital video signal, there are a video signal using voltage and a video signal using current. The video signal input to the pixel uses the constant voltage or the constant current when the light-emitting element emits light. When the video signal uses the constant voltage, the voltage applied to the light-emitting element or the current flowing in the light-emitting element is constant. On the other hand, when the video signal uses the constant current, the voltage applied to the light-emitting element or the current flowing in the light-emitting element is constant. The former one in which the constant voltage is applied to the light-emitting element is referred to as a constant voltage drive, while the latter one in which the constant current flows in the light-emitting element is referred to as a constant current drive. In the constant current drive, the constant current flows without being affected by change of the resistance of the light-emitting element. Either of a driving method by the video signal using voltage and the driving method by a video signal using current can used in the light-emitting display device and its driving method of the invention. Moreover, either of the constant voltage drive and the constant current drive can employed.

Accordingly, a display device may be provided whose semiconductor element operates without being affected even when being formed over a substrate which is largely affected by heat shrink such as a large substrate.

Embodiment 6

This embodiment describes a pixel circuit, a protective circuit, and an operation thereof.

Figure 17A:
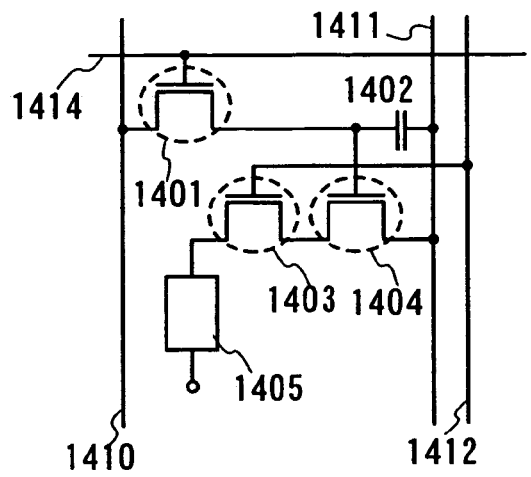
FIGS. 17A to 17F are diagrams each illustrating a pixel circuit of a light-emitting device.

In a pixel shown in FIG. 17A, a signal line 1410 and power source lines 1411 and 1412 are arranged in the column direction, and a scan line 1414 is arranged in the row direction. The pixel comprises a switching TFT 1401, a driving TFT 1403, a current controlling TFT 1404, a capacitor 1402, and a light-emitting element 1405.

Figure 17B:
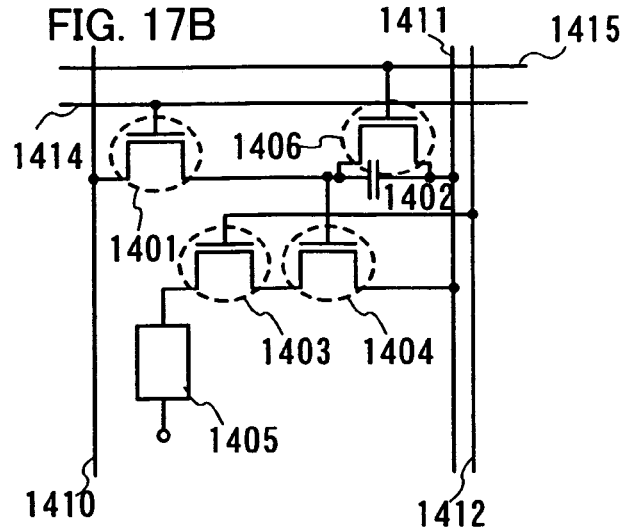
Figure 17C:
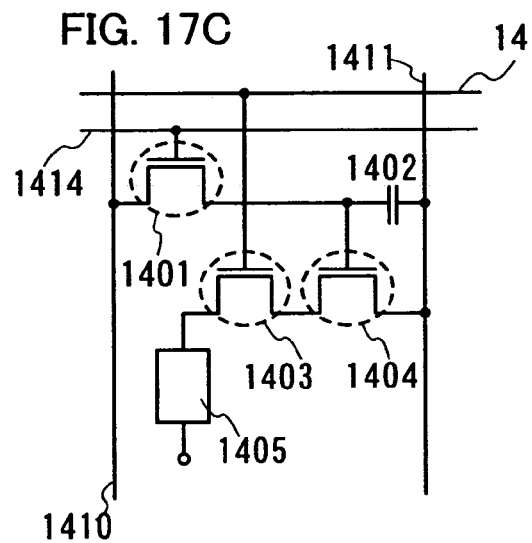
Figure 17D:
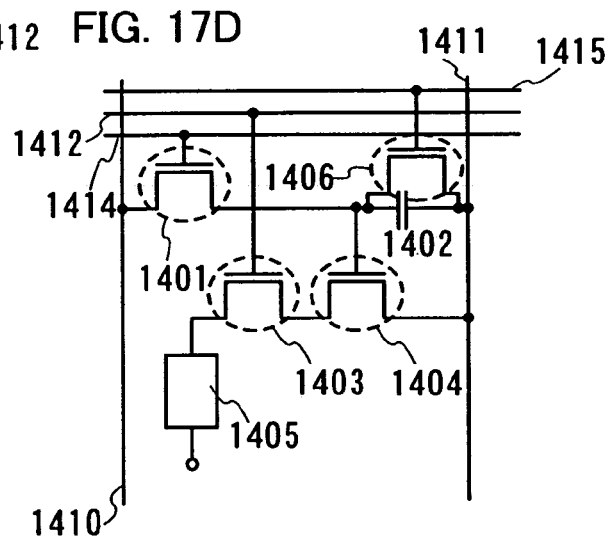

A pixel shown in FIG. 17C has the same configuration as the pixel shown in FIG. 17A, except that a gate electrode of the TFT 1403 is connected to the power source line 1412 arranged in the row direction. That is, the pixels shown in FIGS. 17A and 17C are equivalent circuit diagrams to each other. However, the power source line 1412 arranged in the row direction (FIG. 17A) and the power source line 1412 arranged in the column direction (FIG. 17C) are formed by conductive films of different layers from each other. A wiring connected to the gate electrode of the driving TFT 1403 is focused on here, and description is made separately between FIGS. 17A and 17C in order to illustrate that the wirings are formed by different layers from each other.

In the pixels shown in FIG. 17A and FIG. 17C, the TFTs 1403 and 1404 are connected in series in the pixels. A channel length L(1403) and a channel width W(1403) of the TFT 1403 and a channel length L(1404) and a channel width W(1404) of the TFT 1404 are preferably set so as to satisfy L(1403)/W(1403):L(1404)/W(1404)=5 to 6000:1.

The TFT 1403 operates in a saturation region and controls a current value flowing through the light-emitting element 1405, while the TFT 1404 operates in a linear region and controls current supply to the light-emitting element 1405. It is preferable in view of the forming step that both of the TFTs have the same conductivity type, and they are n-type TFTs in this embodiment. In addition, not only an enhancement type but also a depletion type TFT may be used as the TFT 1403. According to the invention having the above-mentioned structure, the TFT 1404 operates in a linear region, therefore, a slight variation of Vgs of the TFT 1404 does not affect a current value of the light-emitting element 1405. That is, the current value of the light-emitting element 1405 can be determined by the TFT 1403 that operates in a saturation region. Accordingly, a display device can be provided in which the image quality is improved by improving a luminance variation of the light-emitting element due to variations in TFT properties.

In the pixels shown in FIGS. 17A to 17D, the TFT 1401 is a TFT for controlling input of a video signal to the pixel. When the TFT 1401 turns ON and a video signal is inputted to the pixel, a voltage of the video signal is stored in the capacitor 1402. FIGS. 17A and 17C each show a configuration in which the capacitor 1402 is provided, however, the invention is not limited to this, and the capacitor 1402 is not necessarily provided in the case where gate capacitance or the like can be substituted with a capacitor for storing a video signal.

The pixel shown in FIG. 17B has the same pixel configuration as FIG. 17A, except that a TFT 1406 and a scan line 1416 are additionally provided. Similarly, the pixel shown in FIG. 17D has the same pixel configuration as FIG. 17C, except that the TFT 1406 and the scan line 1416 are additionally provided.

The TFT 1406 is controlled to turn ON/OFF by the scan line 1416 which is additionally provided. When the TFT 1406 is turned ON, charges held in the capacitor 1402 are discharged, thereby turning the TFT 1404 OFF. That is, current supply to the light-emitting element 1405 can be forcibly stopped by providing the TFT 1406. Thus, the TFT 1406 may be called an erasing TFT. Consequently, in the configurations shown in FIGS. 17B and 17D, a light-emitting period can start simultaneously with or shortly after a writing period before signals are written to all the pixels, thereby the duty ratio can be improved.

Figure 17E:
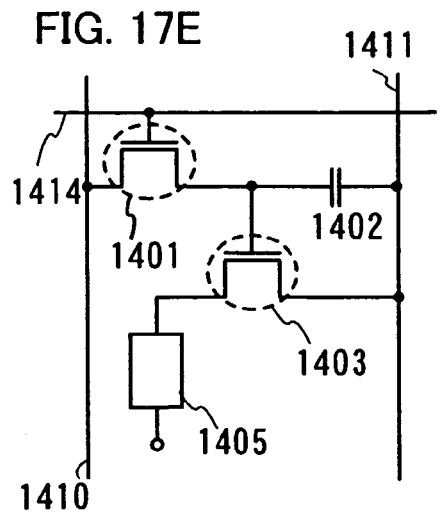
Figure 17F:
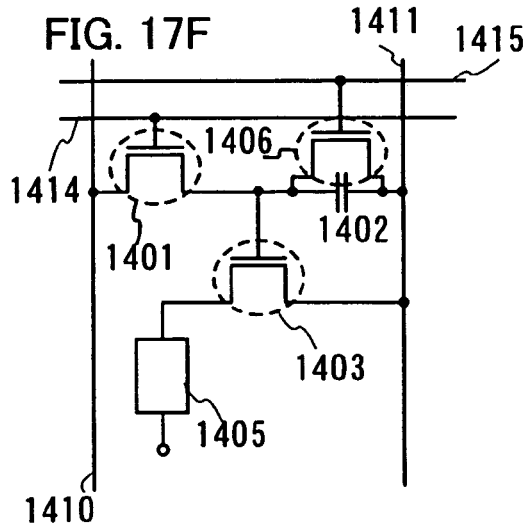

In a pixel shown in FIG. 17E, the signal line 1410 and the power source line 1411 are arranged in a column direction, while the scan line 1414 is arranged in a row direction. The pixel comprises the switching TFT 1401, the driving TFT 1403, the capacitor 1402, and the light-emitting element 1405. A pixel shown in FIG. 14F has the same pixel configuration as FIG. 17E, except that the TFT 1406 and the scan line 1415 are additionally provided. Note that in the configuration of FIG. 17F, the duty ratio can be increased as well by providing the TFT 1406.

As described above, various pixel circuits can be adopted. In the case where a thin film transistor is formed by an amorphous semiconductor film, in particular, a semiconductor film of a driving TFT is preferably formed large. Therefore, the pixel circuits described above are preferably formed to be top-emission type in which light of the electroluminescent layer is emitted from the sealing substrate side.

Such an active matrix light-emitting device is advantageous in that, when the pixel density is increased, it may be operated at low voltage since a TFT is provided for each pixel.

This embodiment describes an active matrix light-emitting device in which each TFT is provided in one pixel, however, a passive matrix light-emitting device can be formed as well in which the TFT is provided per column. In the passive matrix light-emitting device, the high opening ratio is obtained since a TFT is not provided for each pixel. In the case of a light-emitting device in which light is emitted to both sides of the electroluminescent layer, the light transmittance can be increased by employing a passive matrix light-emitting device.

Described next is the case where the equivalent circuit shown in FIG. 17E is adopted and a diode is provided as a protective circuit to the scan line and the signal line.

Figure 18:
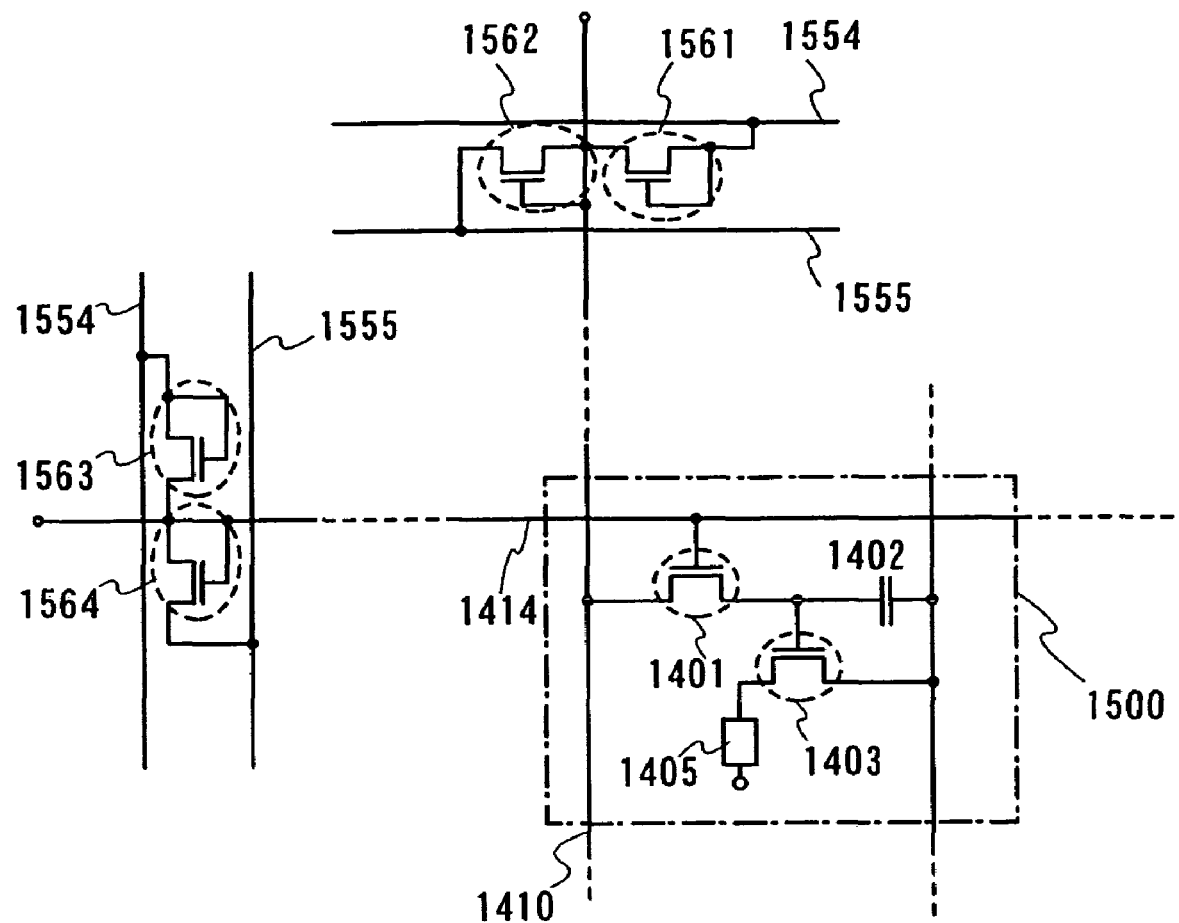
FIG. 18 is a diagram illustrating a protective circuit of a light-emitting device.

In FIG. 18, the TFTs 1401 and 1403, the capacitor 1402, and the light-emitting element 1405 are provided in a pixel portion 1500. Diodes 1561 and 1562 are provided to the signal line 1410. Similarly to the TFTs 1401 and 1403, the diodes 1561 and 1562 are each structured based on the above-described embodiment, and each comprises a gate electrode, a semiconductor layer, a source electrode, a drain electrode, or the like. The diodes 1561 and 1562 are each operated by connecting the gate electrode to the drain electrode or the source electrode.

Common potential lines 1554 and 1555 connected to the diodes are formed by the same layer as the gate electrode. Therefore, in order to connect to the source electrode or the drain electrode of the diode, a contact hole is required to be formed in the gate insulating layer.

Diodes 1563 and 1564 provided to the scan line 1414 have the same structure.

Embodiment 7

Examples of the electronic device to which the invention can be applied include a video camera, a digital camera, a goggle type display (head mounted display), a navigation system, an audio reproducing device (e.g., a car audio component system), a notebook personal computer, a game machine, a portable information terminal (e.g., a mobile computer, a mobile phone, a portable game machine, and an electronic book), and an image reproducing device provided with a recording medium (specifically, a device which is capable of reproducing a recording medium such as a digital versatile disc (DVD) and provided with a display of displaying the reproduced image). FIGS. 19A to 19E show specific examples thereof.

Figure 19A:
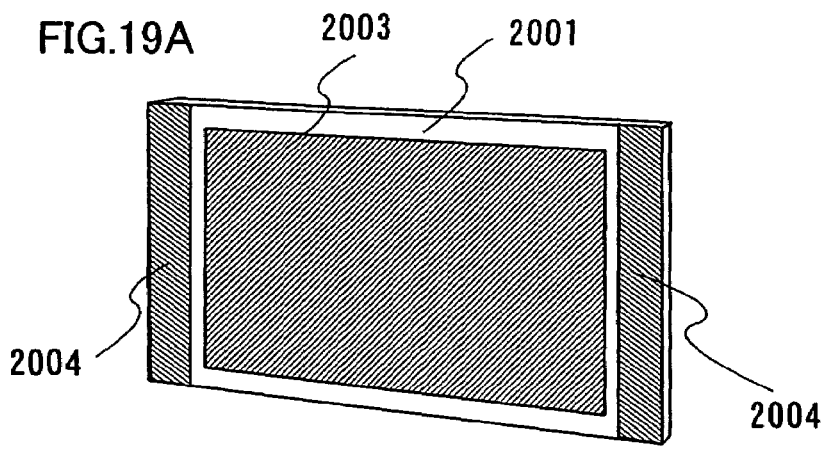
FIGS. 19A to 19E each illustrates an electronic device applicable to the invention.

FIG. 19A shows a light-emitting display device such as a TV receiver, which includes a housing 2001, a display portion 2003 and a speaker portion 2004. The invention is applied to the display portion 2003. According to the invention, yield can be improved as well as the display quality. A polarizer or a circular polarizer may be provided in the pixel portion in order to improve the contrast. For example, a ¼ λ plate film, a ½ λ plate film, and a polarizer film may be provided in this order in the sealing substrate. Further, an antireflection film may be provided over the polarizer.

Figure 19B:
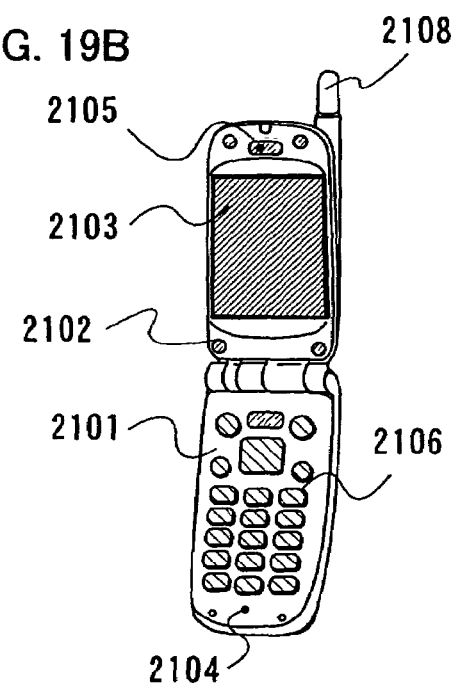

FIG. 19B shows a mobile phone including a main body 2101, housing 2102, a display portion 2103, an audio input portion 2104, an audio output portion 2105, an operating key 2106, and an antenna 2108. The light-emitting device of the invention is applied to the display portion 2103. According to the invention, yield can be improved as well as the display quality.

Figure 19C:
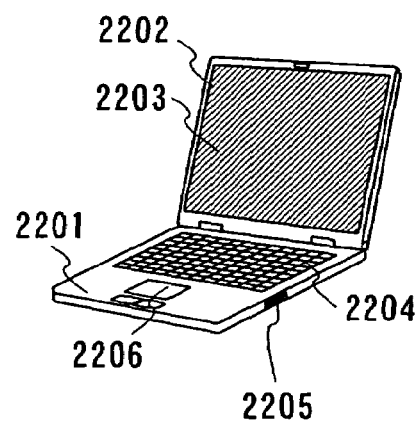

FIG. 19C shows a notebook computer including a main body 2201, a housing 2202, a display portion 2203, a keyboard 2204, an external connection port 2205, and a pointing mouse 2206. The invention can be applied to the display portion 2203. According to the invention, yield can be improved as well as the display quality.

Figure 19D:
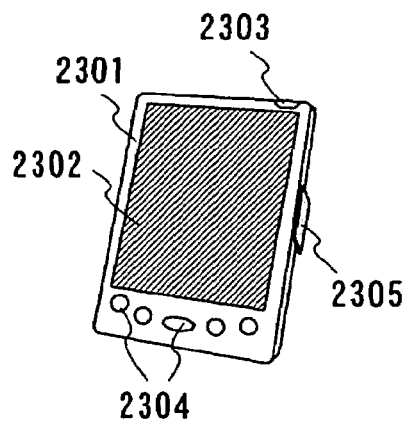

FIG. 19D shows a mobile computer including a main body 2301, a display portion 2302, a switch 2303, operating keys 2304, and an infrared port 2305. The invention can be applied to the display portion 2302. According to the invention, yield can be improved as well as the display quality.

Figure 19E:
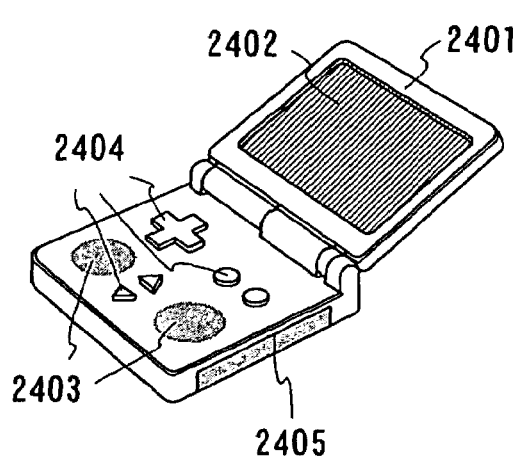

FIG. 19E shows a portable game machine including a housing 2401, a display portion 2402, a speaker portion 2403, operating keys 2404, and a recording medium loading portion 2405. The invention can be applied to the display portion 2402. According to the invention, yield can be improved as well as the display quality.

As set forth above, the invention can be applied to a quite wide range of electronic devices in various fields. In addition, display is less affected by mask deviation so that the yield is improved, the product can be provided at low cost, and a display device which exhibits high image quality can be provided.

Embodiment 8

Figure 21:
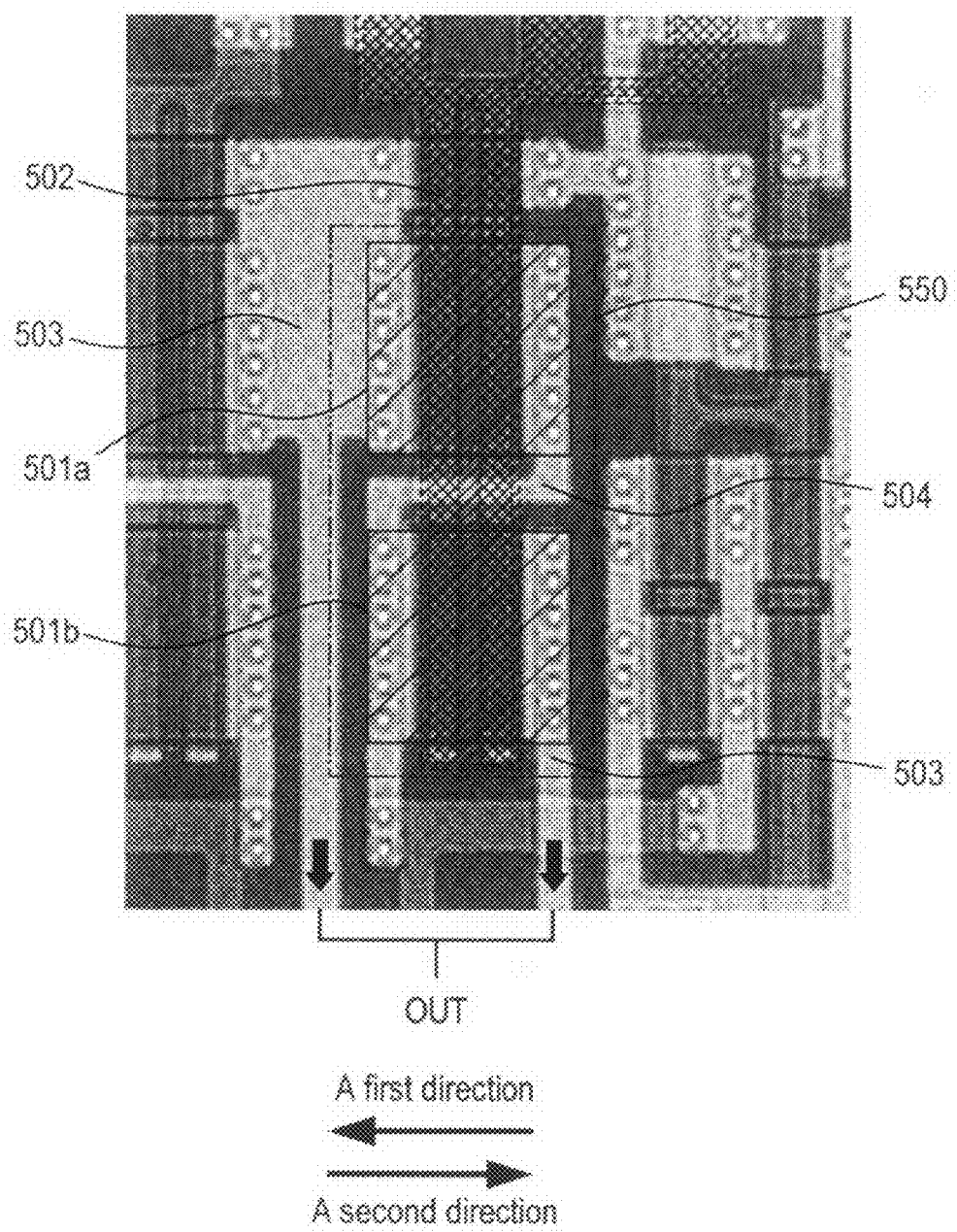
FIG. 21 is a top plan picture of a semiconductor device according to the invention.
Figure 22:
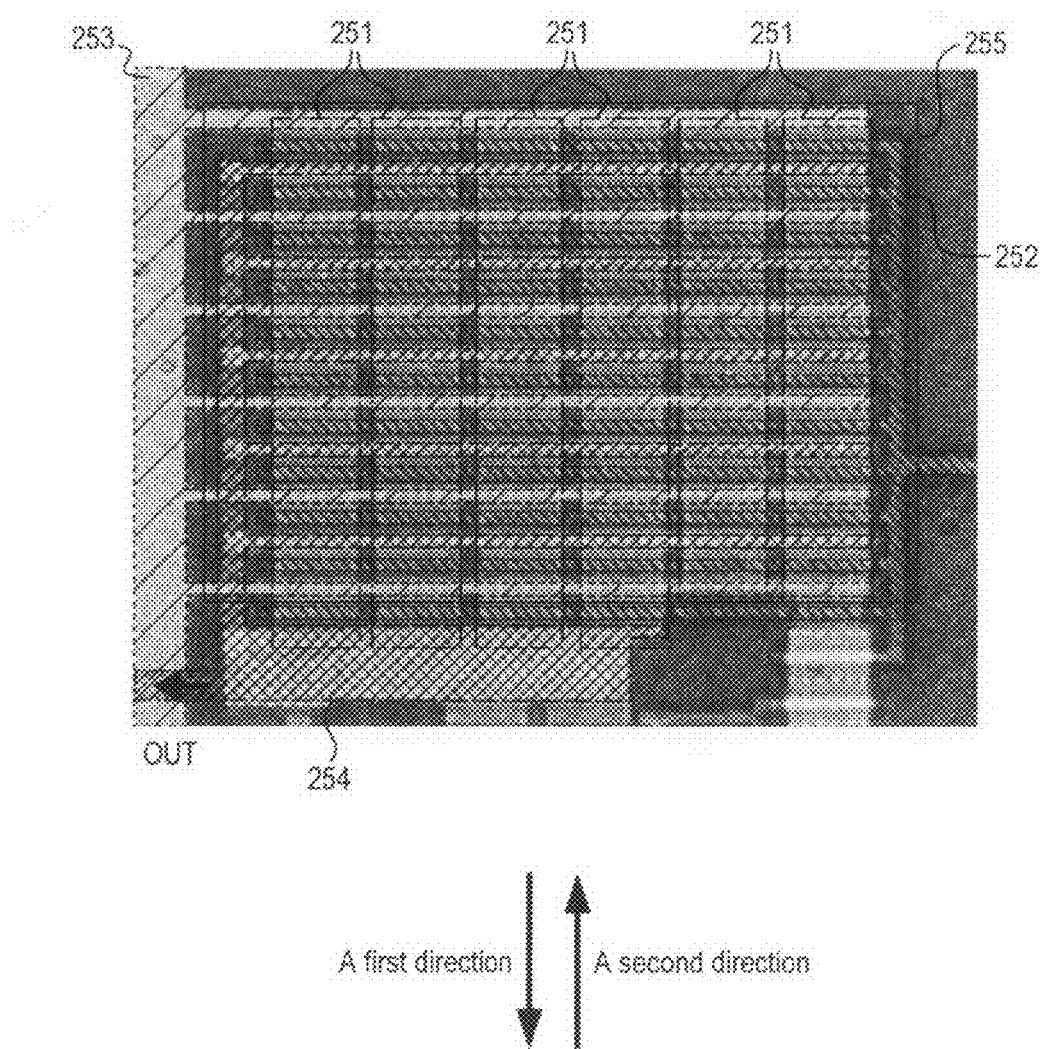
FIG. 22 is a top plan picture of a semiconductor device according to the invention.

Pictures of semiconductor devices manufactured by actually using the invention are shown in FIGS. 21 and 22.

The picture shown in FIG. 21 is an actual transistor of the invention shown in a pattern diagram of FIG. 4. Reference numerals in the drawing are identical to those in FIG. 4.

A transistor 550 of the invention is structured by a transistor comprising the semiconductor layer 501a and a transistor comprising the semiconductor layer 501b, in which the respective gate electrodes 502, source electrodes 504, and drain electrodes 503 are electrically connected between the two transistors. The respective drain electrodes 503 are not connected in the picture, however, they are merged outside the picture to be electrically connected to each other. The semiconductor layers 501a and 501b are equal in width. The source electrode 504 is electrically connected to the transistor comprising the semiconductor layer 501a through contact holes on the observers' left as the gate electrode of the semiconductor layer 501a as the middle, while the source electrode 504 is electrically connected to the transistor comprising the semiconductor layer 501b through contact holes on the observers' right as the gate electrode of the semiconductor layer 501b as the middle. The drain electrode and wiring is connected on the opposite side of the respective semiconductor layers.

The gate electrode 502 is structured by a first-layer gate electrode and a second-layer gate electrode. Respective semiconductor layers each of which does not overlap the first-layer gate electrode while overlaps the second-layer gate electrode are added with a p-type or an n-type impurity at a low concentration. On the other hand, respective semiconductor layers each of which overlaps both the first-layer gate electrode and the second-layer gate electrode are substantially added with neither a p-type nor an n-type impurity. The rest of the respective semiconductor layers is added with the impurity at a high concentration.

By forming a circuit by using such a transistor, a variation in parasitic capacitance formed between the second-layer gate electrode and the semiconductor layer underlying the second-layer gate electrode to which the low concentration impurity is added is suppressed, and an operation margin of the circuit can be easily secured. Furthermore, the circuit reliability and the reliability of an electronic device using the circuit are increased as well.

FIG. 22 is a picture of a transistor of the invention formed by using another layout. In FIG. 22, a transistor 255 of the invention is structured by 60 transistors each of which comprises a semiconductor layer 251, a gate electrode 252 structured by two layers, a source electrode and wiring 253, and a drain electrode and wiring 254.

The 60 transistors are electrically connected among the gate electrodes, among the source electrodes, and among the drain electrodes each other, and the 60 transistors are input with the same signal and output to the same wiring. In the 60 transistors, a transistor through which current flows in a first direction denoted in FIG. 22 and a transistor through which current flows in a second direction are equal in number. In addition, the total of the width of the respective semiconductor layers of the transistors through which current flows in the first direction and each of which overlaps only the second-layer gate electrode, and the total of the width of the respective semiconductor layers of the transistors through which current flows in the second direction and each of which overlaps only the second-layer gate electrode are roughly equal to each other. Accordingly, a transistor of the invention may be formed in which the tolerance on deviation of the second-layer gate electrode in the first direction and in the second direction is larger than that of a conventional structure for securing an operation margin.

This application is based on Japanese Patent Application serial no. 2004-071793 filed in Japan Patent Office on 12th, Mar., 2004, the entire contents of which are hereby incorporated by reference.

What is claimed is:

1. A transistor comprising:
   a first semiconductor island;
   a second semiconductor island;
   a first gate electrode over the first semiconductor island with an insulating film interposed therebetween; and
   a second gate electrode over the second semiconductor island with the insulating film interposed therebetween,
   wherein the first semiconductor island comprises a first source region, a first drain region, a first channel region between the first source region and the first drain region,
   wherein the second semiconductor island comprises a second source region, a second drain region, a second channel region between the second source region and the second drain region,
   wherein the first source region and the second source region are electrically connected to each other,
   wherein the first drain region and the second drain region are electrically connected to each other,
   wherein a first current flow direction through the first channel region of the first semiconductor island is opposite to a second current flow direction through the second channel region of the second semiconductor island,
   wherein each of the first gate electrode and the second gate electrode comprises a first layer and a second layer.

2. The transistor according to claim 1, wherein each of the first source region, the second source region, the first drain region and the second drain region includes one of an n-type impurity element and a p-type impurity element.

3. The transistor according to claim 2,
   wherein a first portion where the first semiconductor island overlaps the second layer of the first gate electrode and does not overlap the first layer of the first gate electrode includes one of an n-type impurity element and a p-type impurity element at lower concentration than that of the first source region, the second source region, the first drain region, and the second drain region,
   wherein a second portion where the second semiconductor island overlaps the second layer of the second gate electrode and does not overlap the first layer of the second gate electrode includes the one of an n-type impurity element and a p-type impurity element at lower concentration than that of the first source region, the second source region, the first drain region, and the second drain region.

4. The transistor according to claim 1, wherein a width of the first channel region is equal to a width of the second channel region.

5. The transistor according to claim 1, wherein the transistor is incorporated into at least one selected from the group consisting of a video camera, a digital camera, a goggle type display, head mounted display, a navigation system, an audio reproducing device, a car audio component system, a personal computer, a game machine, a portable information terminal, a mobile computer, a mobile phone, a portable game machine, and an electronic book, and an image reproducing device provided with a recording medium.

6. A transistor comprising:
   a plurality of first semiconductor islands;
   a plurality of second semiconductor islands;
   an insulating film; and
   a gate electrode having a first layer and a second layer,
   wherein each of the first semiconductor islands comprises a first source region, a first drain region, a first channel region between the first source region and the first drain region,
   wherein each of the second semiconductor islands comprises a second source region, a second drain region, a second channel region between the second source region and the second drain region,
   wherein each of the first source regions of the plurality of first semiconductor islands and each of the second source regions of the plurality of second semiconductor islands are electrically connected to each other,
   wherein each of the first drain regions of the plurality of first semiconductor islands and each of the second drain regions of the plurality of second semiconductor islands are electrically connected to each other,
   wherein a first current flow direction through the first channel regions of the respective first semiconductor islands is opposite to a second current flow direction through the second channel regions of the respective second semiconductor islands.

7. The transistor according to claim 6, wherein a total of widths of the first channel regions is equal to a total of widths of the second channel regions.

8. The transistor according to claim 7, wherein the transistor is incorporated into at least one selected from the group consisting of a video camera, a digital camera, a goggle type display, head mounted display, a navigation system, an audio reproducing device, a car audio component system, a personal computer, a game machine, a portable information terminal, a mobile computer, a mobile phone, a portable game machine, and an electronic book, and an image reproducing device provided with a recording medium.

* * * * *